United States Patent [19]

Ishihara et al.

[11] Patent Number: 4,853,251
[45] Date of Patent: Aug. 1, 1989

[54] PROCESS FOR FORMING DEPOSITED FILM INCLUDING CARBON AS A CONSTITUENT ELEMENT

[75] Inventors: Shunichi Ishihara, Ebina; Shigeru Ohno, Yokohama; Masahiro Kanai; Shunri Oda, both of Tokyo; Isamu Shimizu, Yokohama, all of Japan

[73] Assignee: Canon Kabushiki Kaisha, Tokyo, Japan

[21] Appl. No.: 831,411

[22] Filed: Feb. 20, 1986

[30] Foreign Application Priority Data

| Feb. 22, 1985 | [JP] | Japan | 60-034772 |
| Feb. 25, 1985 | [JP] | Japan | 60-035602 |
| Feb. 26, 1985 | [JP] | Japan | 60-036762 |
| Feb. 27, 1985 | [JP] | Japan | 60-038573 |
| Feb. 28, 1985 | [JP] | Japan | 60-037413 |
| Mar. 1, 1985  | [JP] | Japan | 60-038900 |

[51] Int. Cl.$^4$ .................... B05D 3/06; C23C 16/30
[52] U.S. Cl. .................. 427/38; 427/45.1; 427/122; 427/249; 427/255; 427/255.1; 427/255.2; 427/255.3; 437/225; 437/234
[58] Field of Search ........... 427/255.1, 255.2, 255.3, 427/35, 255, 38, 45.1, 39, 86, 87, 122; 437/225, 234

[56] References Cited

U.S. PATENT DOCUMENTS

| 3,473,978 | 10/1969 | Jackson et al. | 148/175 |
| 3,825,439 | 7/1974 | Tick | 427/255.2 |
| 3,916,034 | 10/1975 | Tsuchimoto | 427/38 |
| 4,077,818 | 3/1978 | Chu | 148/174 |
| 4,084,024 | 4/1978 | Schumacher | 427/255.1 |
| 4,217,374 | 8/1980 | Ovshinsky et al. | 427/39 |
| 4,220,488 | 9/1980 | Duchemin et al. | 148/175 |
| 4,282,267 | 8/1981 | Kuyel | 427/38 |
| 4,402,762 | 9/1983 | John et al. | 148/1.5 |
| 4,410,559 | 10/1983 | Hamakawa et al. | 427/39 |
| 4,419,381 | 12/1983 | Yamazaki | 427/39 |
| 4,430,185 | 2/1984 | Shimomoto et al. | 427/39 |
| 4,434,188 | 2/1984 | Kamo et al. | 427/39 |
| 4,439,463 | 3/1984 | Miller | 427/39 |
| 4,448,801 | 5/1984 | Fukuda et al. | 427/39 |
| 4,450,185 | 5/1984 | Shimizu et al. | 427/39 |
| 4,461,783 | 7/1984 | Yamazaki | 427/39 |
| 4,466,992 | 8/1984 | Dieiling | 427/255.1 |
| 4,468,413 | 8/1984 | Bachmann | 427/39 |
| 4,468,443 | 8/1984 | Shimizu et al. | 430/60 |
| 4,471,042 | 9/1984 | Komatsu et al. | 430/64 |
| 4,485,125 | 11/1984 | Izu et al. | 427/74 |
| 4,504,518 | 3/1985 | Ovshinsky et al. | 427/38 |
| 4,514,437 | 4/1985 | Nath | 427/39 |
| 4,517,223 | 5/1985 | Ovshinsky et al. | 427/39 |
| 4,521,447 | 6/1985 | Ovshinsky et al. | 427/45.1 |
| 4,522,663 | 6/1985 | Ovshinsky et al. | 427/39 |
| 4,526,805 | 7/1985 | Yashizawa | 427/38 |
| 4,532,199 | 7/1985 | Ueno et al. | 427/86 |
| 4,543,267 | 9/1985 | Yamazaki | 427/39 |
| 4,544,423 | 10/1985 | Tsuge et al. | 148/174 |
| 4,546,008 | 10/1985 | Saitoh et al. | 427/38 |
| 4,554,180 | 11/1985 | Hirooka | 427/248.1 |
| 4,564,533 | 1/1986 | Yamazaki | 427/39 |
| 4,564,997 | 1/1986 | Matsuo et al. | 427/47 |
| 4,567,127 | 1/1986 | Saitoh et al. | 430/65 |
| 4,569,697 | 2/1986 | Tsu et al. | 148/1.5 |
| 4,582,560 | 4/1986 | Sanjurjo | 156/613 |
| 4,615,905 | 10/1986 | Ovshinsky | 427/39 |
| 4,657,777 | 4/1987 | Hirooka et al. | 427/39 |
| 4,664,937 | 5/1987 | Ovshinsky et al. | 427/39 |
| 4,689,093 | 8/1987 | Ishihara et al. | 427/39 |

FOREIGN PATENT DOCUMENTS

| 74212 | 3/1983 | European Pat. Off. | 427/248.1 |
| 90586A | 10/1983 | European Pat. Off. | 427/38 |
| 57-66625 | 4/1982 | Japan | 427/38 |
| 59-199035 | 4/1983 | Japan | 427/38 |
| 2038086A | 7/1980 | United Kingdom | 427/248.1 |
| 2148328A | 5/1985 | United Kingdom | 427/248.1 |

OTHER PUBLICATIONS

Brodsky, et al., 22 IBM Technical Disclosure Bulletin 3391 (Jan. 1980).
Janai, et al., 52 J. Appl. Phys. 3622 (May 1981).

Primary Examiner—Sadie Childs
Attorney, Agent, or Firm—Fitzpatrick, Cella, Harper & Scinto

[57] ABSTRACT

A process for forming a deposited film comprises introducing into a film forming space housing a substrate therein an active species (A) formed by decomposition of a compound containing carbon and a halogen and an active species (B) formed from a chemical substance for film formation which is reactive with said active species (A) separately from each other, then providing them with discharge energy and allowing both the species to react with each other thereby to form a deposited film on the substrate.

3 Claims, 3 Drawing Sheets

PROCESS FOR FORMING DEPOSITED FILM INCLUDING CARBON AS A CONSTITUENT ELEMENT

BACKGROUND OF THE INVENTION

1. Field of the Invention

This invention relates to a process suitable for forming a deposited film, above all a functional film, particularly an amorphous or crystalline deposited film to be used for semiconductor devices, photosensitive devices for electrophotography, line sensors for image input, image pick-up devices, photovoltaic devices etc.

2. Description of the Prior Art

For example, for formation of an amorphous silicon film, an amorphous germanium film, etc. the vacuum deposition method, the plasma CVD method, the CVD method, the reactive sputtering method, the ion plating method, the optical CVD method or the like have been attempted to be practiced, and, in general, the plasma CVD method has widely been used and industrialized.

However, for the deposited film constituted of amorphous silicon, amorphous germanium, etc. there is room left for further improvement of overall characteristics with respect to electrical or optical characteristics and fatigue characteristic in repeated uses, or use environmental characteristic, further productivity and mass productivity including uniformity and reproducibility.

The reaction process in formation of an amorphous silicon deposited film, an amorphous germanium deposited film, etc. according to the plasma CVD method generalized in the prior art is considerably complicated as compared with the CVD method of the prior art, and not a few ambiguities existed in its reaction mechanism. Also, there are involved a large number of parameters for formation of such a deposited film (e.g. substrate temperature, flow rates and ratios of gases introduced, pressure during film formation, high frequency power, electrode structure, structure of reaction vessel, gas discharging speed, plasma generation system, etc.), and the plasma formed by combination of such a large number of parameters may sometimes become unstable to frequently give markedly bad influences to the deposited film formed. Besides, the parameters inherent in the device must be chosen for each device, and it has been difficult under the present situation to generalize the production conditions. On the other hand, for exhibiting electrical, optical, photoconductive or mechanical characteristics of an amorphous silicon film, an amorphous germanium film, etc. satisfactorily for respective uses, it has been deemed best to form such a film according to the plasma CVD method under the present situation.

However, depending on the applied uses of the deposited film, since it is required to meet sufficiently requirements of enlargement of area, uniformization of film thickness and uniformity of film quality, and also to attempt to perform a mass production with reproducibility by a high speed film formation, enormous equipment capital becomes necessary for mass production devices in formation of amorphous silicon deposited film, amorphous germanium deposited films, etc. according to the plasma CVD method, and the management items for mass production thereof will become complicated to make the management tolerance narrower. These matters, and also subtlety in adjustment of the devices, have been pointed out as the problems to be improved in the future. On the other hand, in conventional CVD method of the prior art, high temperature is required to be used and no deposited film having practical characteristics could be obtained.

As described above, in formation of amorphous silicon films, amorphous germanium films, etc. it has earnestly been desired to develop a formation process which can perform mass production by means of a low cost device while maintaining practical characteristics and uniformity. These discussions may also be applicable to other functional films such as silicon nitride films, silicon carbide films, silicon oxide films, etc.

SUMMARY OF THE INVENTION

The present invention provides a novel process for formation of a deposited film which removes the drawbacks of the plasma CVD method as described above and also uses no formation method of the prior art.

An object of the present invention is to provide a process for forming a deposited film which is suitable for enlargement of the film and can easily accomplish improvement of productivity and mass production of the film, while attempting to improve the characteristics of the film formed, the film forming speed and reproducibility and also to uniformize film quality.

According to the present invention, there is provided a process for forming a deposited film, which comprises introducing into a film forming space housing a substrate therein an active species (A) formed by decomposition of a compound containing carbon and a halogen and an active species (B) formed from a chemical substance for film formation which is chemically mutually reactive with said active species (A) separately from each other, then providing them with discharge energy and thereby allowing both the species to react chemically with each other to form a deposited film on the substrate.

DESCRIPTION OF THE PREFERRED EMBODIMENTS

Figure 1:
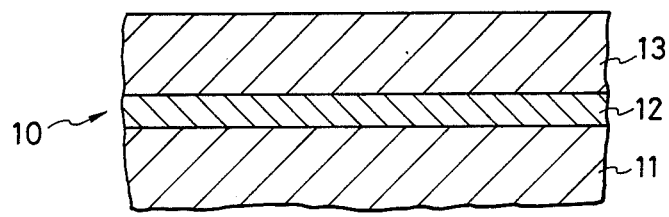
FIG. 1 is a schematic sectional view for illustration of a construction example of the image forming member for electrophotography produced by use of the process of the present invention.

In the process of the present invention, instead of generating plasma in a film forming space for forming a deposited film, discharge energy is applied to both active species (A) formed by decomposition of a compound containing carbon and a halogen and active species (B) formed from a chemical substance for film formation coexisting in the film forming space, thereby causing, accelerating or amplifying chemical mutual reactions. Therefore, it becomes possible to form films by use of lower discharge energy than was used in the prior art, and deposited films thus formed are free from bad influence by etching action or other actions such as abnormal discharging action, etc., during film formation.

Also, according to the present invention, by controlling the atmosphere temperature in the film forming space and the substrate temperature as desired, the CVD process can be made more stable.

Further, if desired, light energy and/or heat energy can be used in combination with discharge energy. Since light energy can be applied by use of an appropriate optical system, to the whole substrate or selectively and controllably to a desired portion of the substrate, the position, thickness, etc. of the deposited film to be formed on the substrate can easily be controlled. Also, heat energy converted from light energy can be used.

One of the points in which the process of the present invention is different from the CVD process of the prior art is to use active species obtained by being previously activated in a space different from the film forming space (hereinafter referred to as activation space). By doing so, the film forming speed can be dramatically increased as compared with the CVD method of the prior art. In addition, the substrate temperature during film formation can be lowered to a great extent, whereby deposited films with stable film quality can be provided commercially in a large amount and yet at low cost.

The term active species (A) as herein mentioned refers to those having the action of promoting formation of deposited films by causing chemical mutual actions with the active species (B) formed from a chemical substance for film formation, thereby imparting energy or causing chemical reactions to occur. Thus, the active species (A) may either contain the constituent elements which become the constituent elements constituting the deposited film to be formed or contain no such constituent element.

In the present invention, the active species (A) from the activation space (A) should preferably be selected and used as desired from those having a life of 0.1 sec. or longer more preferably 1 sec. or longer, optimally 10 sec. or longer, from the standpoint of productivity and easiness is handling.

In the present invention, as the compound containing carbon and halogen to be introduced into the activation space (A), there may be employed, for example, chain or cyclic hydrocarbons of which hydrogen atoms are partially or wholly substituted with halogen atoms, typically chain carbon halides represented by $C_uY_{2u+2}$ (u is an integer of 1 or more, Y is at least one element selected from F, Cl, Br and I) cyclic carbon halides represented by $C_vY_{2v}$ (v is an integer of 3 or more, and Y has the same meaning as defined above), and chain or cyclic compounds represented by $C_uH_xY_y$ (u and Y have the same meanings as defined above, $x+y=2u$ or $2u+2$).

Specific examples may include gaseous or readily gasifiable compounds such as $CF_4$, $(CF_2)_4$, $(CF_2)_5$, $(CF_2)_6$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Cl_3F_3$ and the like.

Also, in the present invention, in addition to the active species (A) formed by decomposition of the compound containing carbon and a halogen, it is also possible to use active species (SX) formed by decomposition of a compound containing silicon and a halogen in combination.

As the compound containing silicon and a halogen, there may be employed, for example, chain or cyclic hydrogenated silicon of which hydrogen atoms are partially or wholly substituted with halogen atoms, typically chain silicon halides represented by $Si_uZ_{2u+2}$ (u is an integer of 1 or more, Z is at least one element selected from F, Cl, Br and I), cyclic silicon halides represented by $Si_vZ_{2v}$ (v is an integer of 3 or more, and has the same meaning as defined above), and chain or cyclic compounds represented by $Si_uH_xZ_y$ (u and Z have the same meanings as defined above, $x+y=2u$ or $2u+2$).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, and the like.

For formation of the active species (A), in addition to the above compound containing carbon and halogen, (and the compound containing silicon and halogen), other silicon compounds such as single substance of silicon, etc., hydrogen, a halogen compound (e.g., $F_2$ gas, $Cl_2$ gas, gasified $Br_2$, $I_2$, etc.) may be used in combination.

Chemical substances for film formation to be used in the present invention are supplied with activation energy in the activation space (B) to be activated, thereby forming the active species (B). The active species (B) is then introduced into the film forming space and react mutually by the action of discharge energy with the foregoing active species (A) simultaneously introduced from the activation space (A), thus resulting easy formation of a desired deposited film on a desired substrate.

As the chemical substance for film formation for forming the active species (B) used in the present invention, there may be included those containing the constituent elements which become the constituent elements constituting the deposited film to be formed and functioning as a starting material for formation of the deposited film or those not containing the constituent elements which become the constituent elements constituting the deposited film to be formed and capable of being considered to merely contribute to film formation. The compounds functioning as a starting material for formation of the deposited film and the compounds contributing to film formation may be used in combination.

The chemical substance for film formation to be used in the present invention may preferably be already gaseous or made gaseous before introduction into activation space (B). For example, when a liquid compound is used, a suitable gasifying device can be connected to the source for supplying the compound, and the compound can be gasified before introduction into the activation space (B).

In the activation space (B) to be used in the process of the present invention, as the above chemical substance for film formaton for forming active species (B), hydrogen gas and/or a halogen compound (e.g. $F_2$ gas, $Cl_2$ gas, gasified $Br_2$, $I_2$, etc.) may be advantageously employed. Also, in addition to these chemical substances for film formation, an inert gas such as helium, argon, neon, etc. may be used. When a plurality of these chemical substances for film formation are to be employed, they can be previously mixed before introduction into the activation space (B), or alternatively these chemical substances can individually be supplied from feeding sources independent of each other to be introduced into the activation space (B), or into independent respective activation spaces to be individually activated therein.

In the activation space (B) to be used in the process of the present invention, as the above chemical substance for film formation for forming active species (B), there may also be advantageously employed silicon containing compounds, carbon containing compounds, germanium containing compounds, oxygen containing compounds and nitrogen containing compounds.

As the silicon containing compound, there may be employed unsubstituted or substituted silanes having hydrogen, halogen and hydrocarbn groups bonded to silicon. Above all, chain or cyclic silane compounds and those chain and cyclic silane compounds of which hydrogen atoms are substituted partially or wholly with halogen atoms are preferred.

Specifically, there may be included, for example, straight chain silane compounds represented by $Si_pH_{2p+2}$ (p is an integer of 1 or more, preferably 1 to 15, more preferably 1 to 10) such as $SiH_4$, $Si_2H_6$, $Si_3H_8$, $Si_4H_{10}$, $Si_5H_{12}$, $Si_6H_{14}$, etc. which may be substituted with halogen; branched chain silane compounds represented by $Si_pH_{2p+2}$ (p has the same meaning as mentioned above) such as $SiH_3SiH(SiH_3)SiH_3$, $SiH_3SiH(SiH_3)Si_3H_7$, $Si_2H_5SiH(SiH_3)Si_2H_5$, etc. which may be substituted with halogen; and cyclic silane compounds represented by $Si_gH_{2g}$ (g is an integer of 3 or more, preferably 3 to 6) such as $Si_3H_6$, $Si_4H_8$, $Si_5H_{10}$, $Si_6H_{12}$, etc. which may be substituted with other cyclic silanyl groups and/or chain silanyl groups. Examples of the above silane compounds in which a part or all of the hydrogen atoms are substituted with halogen atoms may include halo-substituted chain or cyclic silane compounds represented by $Si_rH_sX_t$ (X is a halogen atom, r is an integer of 1 or more, preferably 1 to 10, more preferably 3 to 7, $s+t=2r+2$ or $2r$) such as $SiH_3F$, $SiH_3Cl$, $SiH_3Br$, $SiH_3I$, etc. These compounds may be used either alone or as a combination of two or more compounds.

In the above case, in addition to the silicon containing compounds for film formation, it is possible to introduce one or more kinds of the aforesaid hydrogen gas, a halogen compound (e.g. $F_2$ gas, $Cl_2$ gas, gasified $Br_2$, $I_2$, etc.) and an inert gas such as helium, argon, neon, etc. into the activation space (B). When a plurality of these chemical substances for film formation are to be employed, they can be previously mixed before introduction into the activation space (B), or alternatively these starting gases can individually be supplied from feeding sources independent of each other to be introduced into the activation space (B), or into independent respective activation spaces to be individually activated therein.

As the carbon containing compound, there may be employed preferably gaseous or readily gasifiable compounds selected from chain or cyclic saturated or unsaturated hydrocarbon compounds, organic compounds containing carbon and hydrogen as main constituent atoms and additionally containing at least one of halogen, sulfur, etc. as constituent atoms, and organic silicon compounds containing hydrocarbon groups as constituent components or having silicon-carbon bonds.

Among them, as hydrocarbon compounds, there may be enumerated saturated hydrocarbns having 1 to 5 carbon atoms, ethylenic hydrocarbons having 2 to 5 carbon atoms, acetylenic hydrocarbons having 2 to 4 carbon atoms, including specifically, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methylacetylene ($C_3H_4$), butyne ($C_4H_6$), etc.

As halo-substituted hydrocarbon compounds, there may be enumerated compounds in which at least one of hydrogen atoms which are constituents of the above hydrocarbon compounds are substituted with F, Cl, Br or I, particularly those in which hydrogen is substituted with F or Cl, as effective ones.

The halogens substituted for hydrogen may be either one kind or two or more kinds in one compound.

As organic silicon compounds to be used in the present invention may include organosilanes and organohalogenosilanes.

Organosilanes and organohalogenosilanes are compounds represented, respectively, by the general formulae:

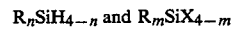

$R_nSiH_{4-n}$ and $R_mSiX_{4-m}$ wherein R is alkyl or aryl; X is F, Cl, Br or I; n=1,2,3 or 4; and m=1,2 or 3, including typically alkylsilanes, arylsilanes, alkylhalogeneosilanes, and arylhalogenosilanes.

Specific example of organochlorosilanes include
trichloromethylsilane, $CH_3SiCl_3$,
dichlorodimethylsilane, $(CH_3)_2SiCl_2$,
chlorotrimethylsilane, $(CH_3)_3SiCl$,
trichloroethylsilane, $C_2H_5SiCl_3$ and
dichlorodiethylsilane, $(C_2H_5)_2SiCl_2$.

Specific examples of organochlorofluorosilanes include
chlorodifluoromethylsilane, $CH_3SiF_2Cl$,
dichlorofuloromethylsilane, $CH_3SiFCl_2$,
chlorofulorodimethylsilane, $(CH_3)_2SiFCl$,
chloroethyldifluorosilane, $(C_5H_5)SiF_2Cl$,
dichloroethylfluorosilane, $C_2H_5SiFCl_2$,
chlorodifluoropropylsilane, $C_3H_7SiF_2Cl$ and
dichlorofluoropropylsilane, $C_3H_7SiFCl_2$.

Specific examples of organosilanes include
tetramethylsilane, $(CH_3)_4Si$,
ethyltrimethylsilane, $(CH_3)_3SiC_2H_5$,
trimethylpropylsilane, $(CH_3)_3SiC_3H_7$,
triethylmethylsilane, $CH_3Si(C_2H_5)_3$ and
tetraethylsilane, $(C_2H_5)_4Si$.

Specific examples of organohydrogenosilanes include
methylsilane, $CH_3SiH_3$,
dimethylsilane, $(CH_3)_2SiH_2$,
trimethylsilane, $(CH_3)_3SiH$,
diethylsilane, $(C_2H_5)_2SiH_2$,
triethylsilane, $(C_2H_5)_3SiH$,
tripropylsilane, $(C_3H_7)_3SiH$ and
diphenylsilane, $(C_6H_5)_2SiH_2$.

Specific examples of organofluorosilanes include
trifluoromethylsilane, $CH_3SiF_3$,
difluorodimethylsilane, $(CH_3)_2SiF_2$,
fluorotrimethylsilane, $(CH_3)_3SiF$,
ethyltrifluorosilane, $C_2H_5SiF_3$,
diethyldifluorosilane, $(C_2H_5)_2SiF_2$,
triethylfulorosilane, $(C_2H_5)_3SiF$ and
trifluoropropylsilane, $(C_3H_7)SiF_3$.

Specific examples of organobromosilanes include
bromotrimethylsilane, $(CH_3)_3SiBr$ and
dibromodimethylsilane, $(CH_3)_2SiBr_2$.

In addition, it is also possible to use organopolysilanes, for example,
organodisilanes such as
hexamethyldisilane, $[(CH_3)_3Si]_2$ and
hexapropyldisilane, $[(C_3H_7)_3Si]_2$.

These carbon containing compounds may be used either alone or as a combination of two or more compounds.

In the above case, in addition to the carbon containing compounds, one or mroe kinds of hydrogen halogen compounds (e.g. $F_2$ gas, $Cl_2$ gas, gasified $Br_2$, $I_2$, etc.) inert gases such as helium, neon, argon, etc. and the aforesaid silicon compounds may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the germanium containing compounds, there may be employed inorganic or organic germanium containing compounds having hydrogen, halogens or hydrocarbon groups bonded to germanium, as exemplified by organic germanium compounds such as chain or cyclic hydrogenated germanium represented by $Ge_aH_b$ (a is an integer of 1 or more, $b = 2a + 2$ or $2a$); polymers of the hydrogenated germanium; compounds in which a part or all of the hydrogen atoms in the above hydrogenated germanium are substituted with halogen atoms; compounds in which a part or all of the hydrogen atoms in the above hydrogenated germanium compounds are substituted with organic groups such as alkyl groups, aryl groups, etc. or, if desired, halogen atoms; etc. and inorganic germanium compounds such as sulfide, imides, etc.

Specifically, there may be enumerated, for example, $GeH_4$, $Ge_2H_6$, $Ge_3H_8$, $n-Ge_4H_{10}$, $tert-Ge_4H_{10}$, $Ge_3H_6$, $Ge_5H_{10}$, $GeH_3F$, $GeH_3Cl$, $GeH_2F_2$, $H_6GeF_6$, $Ge(CH_3)_4$, $Ge(C_2H_5)_4$, $CH_3GeH_3$, $(CH_3)_2GeH_2$, $(CH_3)_3GeH$, $(C_2H_5)_2GeH_2$, $Ge(CH_3)_2F_2$, $GeF_2$, $GeF_4$, $GeS$, $Ge_3N_4$, $Ge(NH_2)_2$, etc.

These germanium compounds may be used either alone or as a combination of two or more compounds.

In the above case, in addition to the germanium containing compounds, one or more kinds of hydrogen, a halogen compound (e.g. $F_2$ gas, $Cl_2$ gas, gasified $Br_2$, $I_2$, etc.), an inert gas such as helium, neon, argon, etc. compounds aforesaid silicon containing compounds or carbon containing may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the oxygen containing compound, there may be mentioned compounds containing oxygen atoms and at least one atom other than oxygen as constituent atoms. Other atoms than oxygen as mentioned above include hydrogen (H), halogens (X=F, Cl, Br or I), sulfur (S), carbon (C), silicon (Si), germanium (Ge), phosphorus (P), boron (B), alkali metals, alkaline earth metals, transition metals, etc. In addition, still other atoms, of elements belonging to the respective groups in the periodic table, which can be bonded to an oxygen atom may be available.

For example, as compounds containing O and H, there may be enumerated $H_2O$, $H_2O_2$, etc.; as compounds containing O and S, oxides such as $SO_2$, $SO_3$, etc.; as compounds containing O and C, oxides such as $CO$, $CO_2$, etc.; as compounds containing O and Si, siloxanes such as disiloxane ($H_3SiOSiH_3$), trisiloxane ($H_3Si$-$OSiH_2OSiH_3$), etc., organoacetoxylsilanes such as diacetoxydimethylsilane $(CH_3)_2Si(OCOCH_3)_2$, triacetoxymethylsilane $CH_3Si(OCOCH_3)_3$, etc., alkylalkoxysilanes such as methoxytrimethylsilane $(CH_3)_3Si$-$OCH_3$, dimethoxydimethylsilane $(CH_3)_2Si(OCH_3)_2$, trimethoxymethylsilane $CH_3Si(OCH_3)_3$), etc.; organosilanols such as trimethylsilanol $(CH_3)_3SiOH$, dimethylphenyl silanol $(CH_3)_2(C_6H_5)SiOH$, diethylsilanediol $(C_2H_5)_2Si(OH)_2$, etc.; as compounds containing O and Ge, oxides, hydroxides of Ge, germanic acids, organic germanium compounds such as $H_3GeOGeH_3$, $H_3GeOGeH_2OGeH_3$, etc., but the oxygen containing compounds to be used in the present invention are not limited to these compounds.

These oxygen containing compounds may be used either alone or as a combination of two or more compounds.

Also, it is possible to use gases other than these compounds such as $O_2$, $O_3$, etc.

In the above case, in addition to the oxygen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds or germanium containing compounds into the activation space (B). When a plurality of these chemical substances for film formation are to be employed, they can be previously mixed in a gaseous state before introduction into the activation space (B), or alternatively these chemical substances for film formation can individually be supplied from feeding sources independent of each other to be introduced into the activation space (B), or into independent respective activation spaces to be individually activated therein.

As the nitrogen containing compound, there may be included compounds containing nitrogen atoms and at least one atom other than nitrogen as constituent atoms. Other atoms than nitrogen as mentioned above include hydrogen (H), halogens (X=F, Cl, Br or I), sulfur (S), carbon (C), oxygen (O), phosphorus (P), silicon (Si), germanium (Ge), boron (B), alkali metals, alkaline earth metals, transition metals, etc. In addition, still other atoms, of elements belonging to the respective groups in the periodic table, which can be bonded to an nitrogen atom may be available.

For example, as compounds containing N and H; there may be enumerated $NH_3$, $NH_4H_3$, $N_2H_5N_3$, $H_2NNH_2$, primary to tertiary amines, halides of these amines, hydroxylamine, etc.; as compounds containing N and X, $N_3X$, $N_2X_2$, $NX_3$, $NOX$, $NO_2X$, $NO_3X_4$, etc.; as compounds containing N and S, $N_4S_4$, $N_2S_5$, etc.; as compounds containing N and C, $N(CH_3)_3$, HCN and cyanides, HOCN and salts thereof, etc.; as compounds containing N and O, $N_2O$, $NO$, $NO_2$, $N_2O_3$, $N_2O_4$, $N_2O_5$, $NO_3$, etc.; as compounds containing N and P, $P_3N_5$, $P_2N_3$, PN, etc. In addition, there may also be employed organosilazanes such as triethylsilazane $(C_2H_5)_3SiNH_2$, hexamethyldisilazane $[(CH_3)_3Si]_2NH$, hexaethyldisilazane $[(C_2H_5)_3Si]_2NH$, etc.; organosilicon isocyanates such as trimethylsilicon isocyanate $(CH_3)_3SiNCO$, dimethylsilicon diisocyanate $(CH_3)_2Si(NCO)_2$, etc.; organosilicon isothiocyanates such as trimethylsilicon isothiocyanate $(CH_3)_3SiNCS$, etc. The nitrogen containing compound is not limited to these compounds provided that the compound is fit for attaining the object of the present invention.

These nitrogen containing compounds may be used either alone or as a combination of two or more compounds. Also, it is possible to use $N_2$ gas.

In the above case, in addition to the nitrogen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds, germanium containing compounds or oxygen containing compounds into the activation space (B). When a plurality of these chemical substances for film formation are to be employed, they can be previously mixed in a gaseous state before introduction into the activation space (B), or alternatively these chemical substances for film formation can individually be supplied from feeding sources independent of each other to be introduced into the activation space (B), or into independent respective activation spaces to be individually activated therein.

In the present invention, the proportion in amount of the active species (A) to the active species (B) in the film forming space may suitably be determined depending on the depositing conditions, the kind of activated species, etc., but may preferably be 10:1 to 1:10, more preferably 8:2 to 4:6.

In the present invention, as the method for forming activate species (A) and (B) in the activation spaces (A) and (B), respectively, there may be employed various activation energies such as electrical energies including microwave, RF, low frequency, DC, etc., heat energies including heater heating, IR-ray heating, etc., optical energies and the like in view of the respective conditions and the device.

On the other hand, the deposited film formed according to the present invention can be doped with impurity elements during or after film formation. As the impurity elements to be used, there may be employed, as p-type impurities, elements belonging to group III A of the periodic table such as B, Al, Ga, In, Tl, etc. and, as n-type impurities, elements belonging to group VA of the periodic table such as N, P, As, Sb, Bi, etc. as suitable ones. Particularly, B, Ga, P and Sb are most preferred. The doping amount of impurities may be determined suitably depending on the desired electrical and optical characteristics.

Among compounds containing such impurity atoms as the components, it is preferable to select a compound which is gaseous under normal temperature and normal pressure, or gaseous at least under the activating conditions, or a compound which can be readily gasified by a suitable gasifying device. Such compounds include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The compounds containing impurity atoms may be used either alone or as a combination of two or more compounds.

The substances for introduction of impurities may be introduced into the activation space (A) and/or the activation space (B) together with the respective substances for formation of the active species (A) and the active species (B) to be activated therein alternatively activated in a third activation space (C) separate from the activation space (A) and the activation space (B). The substance for introduction of impurity can be employed by selecting suitably the activation energy as described above. The active species formed by activation of the substance for introduction of impurity (PN) may be previously mixed with the active species (A) and/or the active species (B) before introduction into the film forming space or independently introduced into the film forming space.

Next, the present invention is described by referring to a typical example of the image forming member for electrophotography formed by the process of the present invention.

FIG. 1 is a schematic sectional view for illustration of the construction example of a typical photoconductive member obtained by the present invention.

Photoconductive member 10 shown in FIG. 1 is applicable as an image forming member for electrophotography, and has a layer constitution consisting of intermediate layer 12 which may optinally be provided and photosensitive layer 13 provided on substrate 11 for photoconductive member.

In preparation of the photoconductive member 10, intermediate layer 12 and/or the photosensitive member 13 can be prepared according to the process of the present invention. Further, when the photoconductive member 10 has an protective layer provided for the purpose of protecting chemically or physically the surface of the photosensitive layer 13, or a lower barrier layer and/or an upper barrier layer provided for improving dielectric strength, these layers can also be prepared according to the process of the present invention.

The substrate 11 may be either electroconductive or insulating. As electroconductive substrates, there may be mentioned metals such as NiCr, stainless steel, Al, Cr, Mo, Au, Ir, Nb, Ta, V, Ti, Pt, Pd, etc. or alloys thereof.

As insulating substrates, there may conventionally be used films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and so on. At least one side surface of these substrates is preferably subjected to treatment for imparting electroconductivity, and it is desirable to form other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$), etc. thereon. Alternatively, a synthetic resin film such as a polyester film can be subjected to the electroconductive treatment on its surface by, for example, vacuum vapor deposition, electron-beam deposition or sputtering of a metral such as NiCr, Al, Ag, Pb, Zn, Ni, Au, Cr, Mo, Ir, Nb, Ta, V, Ti, Pt, etc. or by laminating treatment with the said metal, thereby imparting electroconductivity to the surface. The substrate may be shaped in any form such as cylinders, belts, plates or others, and its form may be determined as desired. For example, when the photoconductive member 10 in FIG. 1 is to be used as a light-receiving member for electrophotography, it may desirably be formed into an endless belt or a cylinder for use in continuous high speed copying.

For example, the intermediate layer 12 has the function of impeding effectively inflow of the carriers from the side of the substrate 11 into the photosensitive layer 13 and permitting easy passage of the photocarriers, formed in the photosensitive layer 13 by irradiation of electromagnetic wave and migrating toward the side of the substrate 11, from the side of the photosensitive layer 13 to the side of the substrate 11.

The intermediate layer 12 may be constituted of, for example, amorphous carbon having a matrix of carbon atoms and optionally containing hydrogen atoms(H) and/or halogen atoms(X) and/or silicon atoms, as constituent atoms (hereinafter written as "A-C(H, X, Si)"); amorphous carbon having a matrix of carbon atoms and optionally containing hydrogen atoms (H) and/or halogen atoms (X), as constituent atoms (hereinafter written as "A-C(H, X)"); amorphous silicon having a matrix of silicon atoms and optionally containing hydrogen atoms (H) and/or halogen atoms (X) (hereinafter written as A-Si(H, X)); an amorphous material having a matrix of silicon atoms and carbon atoms and optionally containing hydrogen atoms (H) and/or halogen atoms (X), as constitutent atoms (hereinafter written as "A-SiC(H, X)"); amorphous germanium containing optionally silicon atoms (Si), hydrogen atoms (H), halogen atoms (X) and/or carbon atoms (C) as constituent atoms (hereinafter written as "A-Ge(Si, H, X, C)"); an amorphous material having a matrix of silicon atoms and germanium atoms and optionally containing hydrogen atoms and/or halogen atoms (hereinafter written as "A-SiGe(H, X)"); an amorphous material containing silicon atoms, oxygen atoms and carbon atoms, optionally together with hydrogen atoms (H) and/or halogen atoms (X), as constituent atoms (hereinafter written as "A-SiOC(H, X)"); an amorphous material containing silicon atoms, nitrogen atoms and carbon atoms, optionally together with oxygen atoms, hydrogen atoms (H) and/or halogen atoms (X) as constituent atoms (hereinafter written as "A-SiNC(O, H, X)"), etc. and at the same time can sometimes contain, for example, a p-type impurity such as B or an n-type impurity such as P as a substance for controlling electroconductivity, if necessary.

In the present invention, the content of substances controlling conductivity such as B, P, etc. contained in the intermediate layer 12 may preferably be 0.001 to $5 \times 10^4$ atomic ppm, more preferably 0.5 to $1 \times 10^4$ atomic ppm, optimally 1 to $5 \times 10^3$ atomic ppm.

In the case of forming the intermediate layer 12, as starting materials for formation of the intermediate layer, active species (A) formed in activation space (A) and active species (B) formed in activation space (B), optionally together with active species formed by activation of hydrogen, halogens, inert gases, gases of silicon containing compounds, germanium containing compounds, carbon containing compounds, compounds containing impurity elements as components, etc. may be introduced respectively and separately into the film forming space, in which the substrate 11 is placed, and the intermediate layer 12 may be formed on the substrate 11 by applying discharge energy to the coexistance atmosphere of the respective species introduced to cause chemical reaction.

The compound containing carbon and halogen capable of forming active species (A) by introduction into the activation space (A) during formation of the intermediate layer 12 should desirably be one selected from the compounds as mentioned above which can form readily active species such as, for example, $CF_2^*$. Similarly, as the compound containing silicon and halogen, it is desirable to select a compound from the compounds as mentioned above which can form readily active species such as, for example $SiF_2^*$.

The intermediate layer 12 should have a layer thickness preferably 30 Å to 10 μ, more preferably 40 Å to 8 μ, optimally 50 Å to 5 μ.

The photosensitive layer 13 is constituted of, for example, an amorphous material having a matrix of silicon atoms and optionally containing hydrogen atoms and/or halogen atoms (X) as constituent atoms (hereinafter referred to as "A-Si(H,X)"); an amorphous material having a matrix of silicon atoms and carbon atoms and optionally containing hydrogen atoms (H) and/or halogen atoms (X) (hereinafter referred to as "A-SiC(H,X)"; an amorphous material having a matrix of silicon atoms and optionally containing hydrogen, halogen germanium, carbon, etc. as constituent atoms (hereinafter referred to as A-Si(H, X, Ge, C); and amorphous material having a matrix of silicon atoms and germanium atoms optionally containing hydrogen, halogen, carbon, etc. (A-SiGe(H,X,C)) and the like, and has both functions of the charge generation function of generating photocarriers by irradiation of laser beam and the function of transporting the charges.

The photosensitive layer 13 should have a layer thickness preferably of 1 to 100 μ, more preferably 1 to 80 μ, optimally 2 to 50 μ.

The photosensitive layer 13 is constituted of non-doped A-Si(H,X), A-SiC(H,X), A-Si(H,X,Ge,C), A-SiGe(H,X,C), etc. but it may also contain a substance for controlling conductivity characteristic with a polarity different from the polarity of the substance for controlling conductivity characteristic contained in the intermediate layer 12 (e.g. n-type), if desired, or a substance of the same polarity may be contained therein, when the practical amount contained in the intermediate layer 12 is much, in an amount by far smaller than said amount.

Formation of the photosensitive layer 13 may be practiced, similarly as in the case of the intermediate layer 12, if it is to be prepared according to the process of the present invention, by introducing a compound containing carbon and halogen and separately a compound containing silicon and halogen into the activation space (A), decomposing these under a high temperature or exciting these through the action of discharging energy or light energy to form active species (A) and introducing said active species (A) into deposition space.

In the case of forming a intermediate layer 12 which is similar to or the same in constituents as the photosensitive layer 13, up to formation of the photoconductive layer 13 can continuously be performed subsequent to formation of the intermediate layer 12.

Further, if desired, it is also possible to form an amorphous deposited film containing carbon and silicon as constituent atoms as the surface layer on the photosensitive layer and, in this case, film formation can also be conducted according to the process of the present invention, similarly as the above intermediate layer and photosensitive layer.

Figure 2:
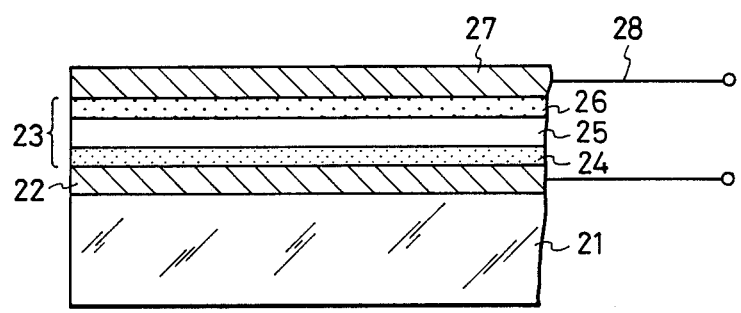
FIG. 2 is a schematic sectional view for illustration of a construction example of a PIN type diode produced by use of the process of the present invention.

FIG. 2 is a schematic illustraction showing a typical example of a PIN type diode device utilizing a deposited film doped with an impurity element prepared by carrying out the process of the present invention.

In the drawing, 21 is a substrate, 22 and 27 are thin film electrodes, 23 is a semiconductor film consisting of an n-type semiconductor layer 24, an i-type semiconductor layer 25 and a p-type A-Si semiconductor layer 26. While the present invention may be applicable for preparation of any one layer of the semiconductor layers 24, 25 and 26, particularly the semiconductor layer 26 can be prepared according to the process of the present invention to enhance conversion efficiency.

When the semiconductor layer 26 is prepared by the process of the present invention, the semiconductor layer 26 can be constructed of, for example, an amorphous material containing silicon atoms, carbon atoms, hydrogen atoms and/or halogen atoms as constituent atoms (hereinafter referred to as "A-SiC(H,X)"); an amorphous material containing silicon atoms, carbon atoms, germanium atoms, hydrogen atoms and/or halogen atoms as constituent atoms (hereinafter referred to as "A-SiGeC(H,X)"); an amorphous material containing silicon atoms, carbon atoms, oxygen atoms, hydrogen atoms and/or halogen atoms as constituent atoms (hereinafter referred to as "A-SiCO(H,X)"); an amorphous material containing silicon atms, nitrogen atoms, carbon atoms, hydrogen atoms and/or halogen atoms (hereinafter referred to "A-SiNC(H,X)"), etc. 28 is a conductive wire to be connected to the external electrical circuit.

As the substrate 21, there may be employed a conductive, semiconductive or insulating substrate.

When the substrate 21 is conductive, the thin film electrode 22 may be omitted. As the semiconductive substrate, there may be employed, for example, semiconductors such as Si, Ge, GaAs, ZnO, ZnS, etc. Thin film electrodes 22, 27 can be obtained by forming thin films of NiCr, Al, Cr, Mo, Au, Ir, Nb, Ta, V, Ti, Pt, Pd, $In_2O_3$, $SnO_2$, $ITO(In_2O_3+SnO_2)$, etc. on the substrate 21 by treatment such as vacuum deposition, electron beam vapor deposition, sputtering, etc. The electrodes 22, 27 have a film thickness preferably of 30 to $5\times10^4$ Å, more preferably 100 to $5\times10^3$ Å.

For rendering the film constituting the semiconductor layer n-type or p-type, if desired, it can be formed by doping an n-type impurity or a p-type impurity or both impurities into the layer to be formed, while controlling its amount, during layer formation.

Formation of n-type, i-type and p-type semiconductor layers can be carried out according to the process of the present invention by introducing a compound containing carbon and halogen into the activation space (A) and decomposing it by the action of an activation energy to form active species (A) of, for example, $CF_2^*$, etc., and separately introducing a compound containing silicon and halogen into an activation space (C) other than the activation space (A) and decomposing it by the action of an activation energy to form active species of, for example, $SiF_2^*$, etc., and then introducing these active species into the film forming space. Also, separately, chemical substances for film formation introduced into the activation space (B), optionally together with an inert gas and a gas containing an impurity element as the component, may be respectively excited and decomposed by respective activation energies to form respective active species, which are then separately or in an appropriate mixture introduced into the film forming space in which substrate 11 is placed to form a deposited film by use of discharge energy. The n-type and p-type semiconductor layers should have a layer thickness preferably of 100 to $10^4$ Å, more preferably 300 to 2000 Å. On the other hand, the i-type semiconductor layer should preferably have a layer thickness preferably of 500 to $10^4$ Å, more preferably 1000 to 10000 Å.

The PIN type diode device shown in FIG. 2 is not necessarily required to prepare all the layers of P, I and N according to the process of the present invention, and the present invention can be carried out by preparing at least one layer of P, I and N according to the process of the present invention.

According to the process for forming a deposited film of the present invention, electrical, optical, photoconductive and mechanical characteristics desired for the film to be formed can be improved, and yet a high speed film formation becomes possible. Also, reproducibility in film formation can be improved to enable improvement of the film quality and uniformization of the film quality, and the process is also advantageous in enlargement of area of the film and can easily accomplish improvement of productivity of films as well as bulk production of films. Further, since low discharge energy can be used as an excitation energy during film formation, there can be exhibited such effects that film formation can be effected also on a substrate which is poor in heat resistance, and that the steps can be shortened by low temperature treatment.

The present invention is described by referring to the following Examples.

EXAMPLE 1

Figure 3:
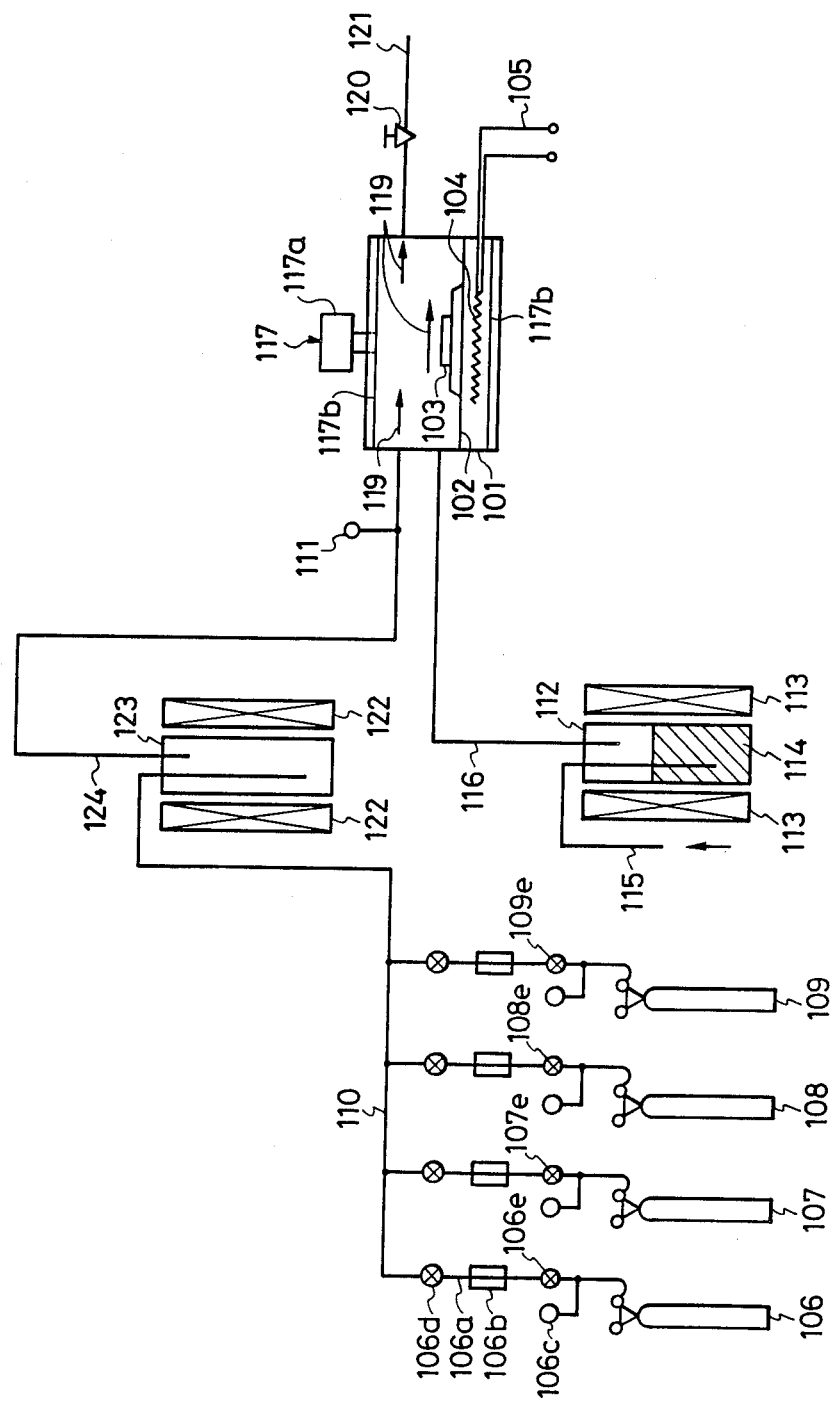
FIG. 3 and FIG. 4 are schematic diagrams for illustration of the constitutions of the devices for practicing the process of the present invention employed in respective examples.

By means of the device as shown in FIG. 3, a carbon-containing amorphous deposited film was formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 103 before the film forming treatment or, after film formation, for annealing treatment for further improvement of the characteristics of the film formed, and electricity is supplied through a conductive wire 105 to generate heat. The substrate temperature is not particularly limited, but when the substrate is required to be heated in practicing the process of the present invention, the substrate temperature may be preferably 30° to 450° C., more preferably 50° to 300° C.

106 through 109 are gas feeding systems, and they are provided corresponding to the kinds of the gases for film formation, and inert gases optionally employed, and the gases of the compounds containing impurity element as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B) 123, and the active species (B) formed is introduced through the inflow pipe 124 into the film forming chamber 101. 111 is a gas pressure gauge.

In the drawing, 112 shows an activation chamber (A), 113 an electric furnace, 114 solid C particles and 115 a pipe for introduction of a gaseous compound containing carbon and halogen as the starting material for active species (A). The active species (A) formed in the activation chamber (A) 112 is introduced through the inflow pipe 116 into the film forming chamber 101.

117 is a discharging energy generating device and is provided with a matching box 117a, a cathode electrode 117b for introduction of high frequency, etc.

The discharging energy from the discharging energy generating device 117 is irradiated on the active species flowing in the direction of the arrowhead 119, and the irradiated active species undergo mutually chemical reaction thereby to form a deposited film of A-Si(H,X) on the whole or the desired portion of the substrate 103. In the drawing, 120 shows a gas discharging valve and 121 a gas discharging pipe.

First, a substrate 103 of polyethyleneterephthalate film was placed on a supporting stand 102, and the film forming chamber 101 was evacuated by use of an evacuating device (not shown) to about $10^{-6}$ Torr. From a gas feeding source 106, $H_2$ gas at 150 SCCM was introduced into the activation chamber (B) 123 through the gas inflow pipe 110. $H_2$ gas, etc. introduced into the activation chamber (B) 123 was activated by means of the microwave plasma generating device 122 to be converted to activated hydrogen, etc., which were then introduced through the inflow pipe 124 into the film forming chamber 101.

On the other hand, the activation chamber (A) 112 was packed with solid C particles 114, heated by the electric furnace 113 to be maintained at about 1100° C., thereby bringing C into red hot state, whereinto $CF_4$ was blown through the inflow pipe 115 from a bomb not shown, thus forming active species of $CF_2^*$, which were then introduced into the film forming chamber 101 via the inflow pipe 116.

Thus, while maintaining the inner pressure in the film forming chamber 101 at 0.4 Torr, discharging energy was allowed to act from the discharging device 117 to form a non-doped or doped carbon-containing amorphous film (film thickness 700 Å). The film forming speed was 32 Å/sec.

Subsequently, the carbon-containing amorphous film sample was placed in a vacuum deposition tank, wherein a comb-type Al-gap electrode (gap length 250 μ, width 5 mm) was formed under vacuum of $10^{-5}$ Torr, and the dark electroconductivity $\sigma_d$ was determined by measuring dark current at an application voltage of 10 V for evaluation of the film characteristics of the respective samples. The results are shown in Table 1A.

EXAMPLE 2

Except for using additionally $F_2$ gas (mixing ratio $H_2/F_2=15$), a carbon-containing amorphous film was formed following the same procedure as in Example 1. The dark electroconductivities were measured for respective samples to obtain the results shown in Table 1A.

From Table 1A, it can be seen that carbon-containing amorphous films excellent in electrical characteristics can be obtained according to the present invention.

EXAMPLE 3

Figure 4:
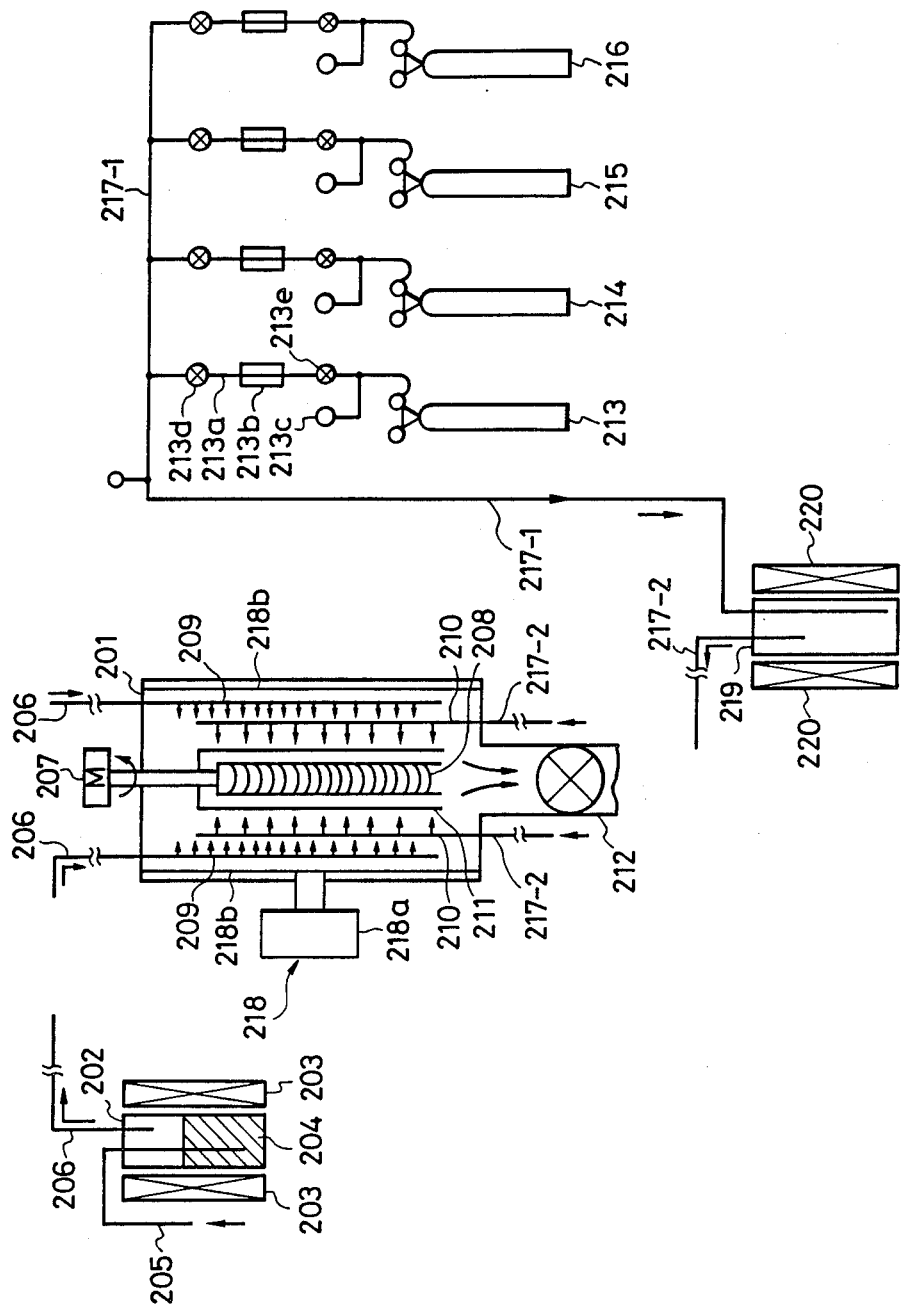

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid C particles, 205 an inflow pipe for the starting material of active species (A), 206 a pipe for introducing active species (A), 207 a motor, 208 a heater which is used similarly as 104 in FIG. 3, 209 and 210 blowing pipes, 211 an aluminum cylinder substrate and 212 a gas discharging valve. 213 through 216 are starting gas feeding systems similarly as 106 through 109 in FIG. 3, and 217-1 is a gas introducing pipe.

In the film forming chamber 201, the aluminum cylinder 211 was suspended, equipped internally thereof with the heater 208 so as to be rotatable with the motor 207. 218 is a discharging energy generating device and is provided with a matching box 218a, a cathode electrode 218b for introduction of high frequency, etc.

Also, the activation chamber (A) 202 was packed with solid C particles 204, heated by the electric furnace 203 to be maintained at about 1100° C. to bring C into red hot state, whereinto $CF_4$ was blown through the inflow pipe 205 from a bomb not shown to form active species of $CF_2^*$ which were introduced into the film forming chamber 201 via the inflow pipe 206. Also, from the activation chamber (C) (not shown) having a structure similar to the activation chamber (A) 202, active species (C) of $SiF_2^*$ from solid Si particles and $SiF_4$ were introduced.

On the other hand, through the inflow pipe 217-1, $H_2$ gas was introduced into the activation chamber (B) 219. The $H_2$ gas introduced was subjected to activation treatment such as plasma formation by means of the microwave plasma generating device 220 in the activation chamber (B) 219 to become activated hydrogen, which was then introduced through the inflow pipe 217-2 into the film forming chamber 201. During this operation, if desired, impurity gases such as $PH_3$, $B_2H_6$, etc. were also activated by introduction into the activation chamber (B) 219. While maintaining the pressure in the film forming chamber 201 at 1.0 Torr, plasma generated from the discharging device 218 was allowed to act.

The aluminum cylinder 211 was heated to 220° C. by the heater, maintained thereat and rotated, while the discharging gas was discharged by controlling adequately the opening of the discharging valve 212. Thus, a photosensitive layer 13 was formed.

Also, the intermediate layer 12 was formed to a film thickness of 2000 Å by introducing a gas mixture of $H_2/B_2H_6$ (0.2% of $B_2H_6$ in terms of vol. %) through the inflow pipe 217-1.

COMPARATIVE EXAMPLE 1

According to the plasma CVD method in general, an image forming member for electrophotography having a layer constitution as shown in FIG. 1 was formed by use of respective gases of $CF_4$, $SiF_4$, $H_2$ and $B_2H_6$ by means of the device having the same film forming chamber as the film forming chamber 201 provided with a high frequency means of 13.56MHz.

The conditions for preparation of the drumshaped image forming members for electrophotography obtained in Example 3 and Comparative example 1 and their performances are shown in Table 2A.

EXAMPLE 4

By means of the device as shown in FIG. 3, a PIN type diode as shown in FIG. 2 was prepared.

First, a polyethylenenaphthalate film 21 having ITO film 22 with a thickness of 1000 Å vapor deposited thereon was placed on a supporting stand and, after reduced to a pressure of $10^{-6}$ Torr, active species SIF$_2$* active species CF$_2$* formed similarly as in Example 3, H$_2$ gas, PH$_3$ gas (diluted to 1000 ppm with hydrogen gas) were respectively introduced into the activation chamber (B) 123 to be activated. Subsequently, the activated gases were introduced through the inflow pipe 116 into the film forming chamber 101. While maintaining the pressure in the film forming chamber 101 at 0.1 Torr, plasma was allowed to act from the discharging device 218 to form a n-type A-SiC(H,X) film 24 (film thickness: 700 Å) doped with P.

Next, according to the same method as in formation of the n-type A-SiC(H,X) film except for stopping introduction of PH$_3$ gas and increasing the value of SiF$_2$*/CF$_2$* to three-fold, a non-doped type A-SiC(H,X) film 25 (film thickness: 5000 Å) was formed.

Subsequently, by use of B$_2$H$_6$ gas (diluted to 1000 ppm with hydrogen gas) at 40 SCCM together with H$_2$ gas, following otherwise the same conditions as in the case of n-type, a p-type A-SiC(H,X) film 26 (film thickness: 700 Å) doped with B was formed. On this p-type film was further formed by vapor deposition an aluminum electrode 27 with a thickness of 1000 Å to provide a PIN type diode.

The diode element thus obtained (area 1 cm$^2$) was subjected to measurement of I–V characteristic, and rectifying characteristic and photovoltaic effect were evaluated. The results are shown in Table 3A.

Also, in photoirradiation characteristics, light was introduced from the substrate side, and a conversion efficiency of 8.3% or higher, an open circuit voltage of 0.98 V and a short circuit current of 11.0 mA/cm$^2$ were obtained at a photoirradiation intensity AMI (about 100 mW/cm$^2$).

EXAMPLE 5

Except for using additionally F$_2$ gas (H$_2$/F$_2$=15), the same PIN type diode as in Example 6 was prepared. The rectifying characteristic and photovoltaic effect were evaluated and the results are shown in Table 3A.

From Table 3A, it can be seen that an amorphous semiconductor PIN type diode having better optical and electrical characteristics as compared with the prior art can be obtained according to the present invention.

EXAMPLE 6

By means of the device as shown in FIG. 3, i-type, p-type and n-type A-SiC(H,X) deposited films were formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The substrate temperature is not particularly limited, but when the substrate is required to be heated in practicing the process of the present invention, the substrate temperature may be preferably 50° to 450° C., more preferably 100° to 350° C.

106 through 109 are gas feeding systems, and they are provided corresponding to the kinds of the compounds containing silicon, and hydrogen, halogen compounds, and gases of the compounds containing impurities as the component which are optionally employed. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B) 123, and the active species (B) formed is introduced through the inflow pipe 124 into the film forming chamber 101. 111 is a gas pressure gauge. In the drawing, 112 shows an activation chamber (A), 113 an electric furnace, 114 solid C particles and 115 a pipe for introduction of a gaseous compound containing carbon and halogen as the starting material for active species (A). The active species (A) formed in the activation chamber (A) 112 is introduced through the inflow pipe 116 into the film forming chamber 101.

117 is a discharging energy generating device and is provided with a matching box 117a, a cathode electrode 117b for introduciton of high frequency, etc.

The discharging energy from the discharging energy generating device 117 is irradiated on the active species flowing in the direction of the arrowhead 119, and the irradiated active species undergo mutually chemical reaction thereby to form a deposited film of A-SiC(H,X) on the whole or the desired portion of the substrate 103. In the drawing, 120 shows a gas discharging valve and 121 a gas discharging pipe.

First, a substrate 103 of polyethyleneterephthalate film was placed on a supporting stand 102, and the film forming chamber 101 was evacuated by use of an evacuating device (not shown) to about 10$^{-6}$ Torr. From a gas feeding system 106, SiH$_4$ at 150 SCCM or a gas mixture thereof with PH$_3$ gas or B$_2$H$_6$ gas (each being diluted to 1000 ppm with hydrogen gas) at 40 SCCM was introduced into the activation chamber (B) 123 through the gas inflow pipe 110. SiH$_4$ gas, H$_2$ gas, etc. introduced into the activation chamber (B) 123 were activated by means of the microwave plasma generating device 122 to be converted to SiH$_2$*, activated hydrogen, etc., which were then introduced through the inflow pipe 124 into the film forming chamber 101.

On the other hand, the activation chamber (A) 112 was packed with solid C particles 114, heated by the electric furnace 113, thereby bringing C into red hot state, whereinto CF$_4$ was blown through the inflow pipe 115 from a bomb not shown, thus forming active species of CF$_2$*, which were then introduced into the film forming chamber 101 via the inflow pipe 116.

While maintaining the inner pressure in the film forming chamber 101 at 0.4 Torr, plasma was allowed to act from the discharging device to form a non-doped or doped A-SiC(H,X) film (film thickness 700 Å). The film forming speed was 24 Å/sec.

Subsequently, the non-doped or p-type or n-type A-SiC(H,X) film sample was placed in a vacuum deposition tank, wherein a comb-type Al-gap electrode (gap length 250 μm width 5 mm) was formed under vacuum of 10$^{-5}$ Torr, and the dark electroconductivity $\sigma_d$ was determined by measuring dark current at an application voltage of 10 V for evaluation of the film characteristics of the respective samples. The results are shown in Table 1B.

EXAMPLE 7-9

Except for using straight $Si_2H_6$, branched $Si_4H_{10}$ or $H_6Si_6F_6$ in place of $SiH_4$, A-SiC(H,X) films similar to Example 6 were formed. The dark electroconductivities were measured to obtain the results shown in Table 1B.

From Table 1B, it can be seen that A-SiC(H,X) films excellent in electrical characteristics can be obtained according to the present invention and also that A-SiC(H,X) films sufficiently doped can be obtained.

EXAMPLE 10

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid C particles, 205 an inflow pipe for the starting material of active species (A), 206 a pipe for introducing active species (A), 207 a motor, 208 a heater which is used similarly as 104 in FIG. 3, 209 and 210 are blowing pipes, 211 an aluminum cylinder substrate and 212 a gas discharging valve. 213 through 216 are starting gas feeding systems similarly as 106 through 109 in FIG. 3, and 217-1 is a gas introducing pipe.

In the film forming chamber 201, the aluminum cylinder 211 was suspended, equipped internally thereof with the heater 208 so as to be rotatable with the motor 207. 218 is a discharging energy generating device and is provided with a matching box 218a, a cathode electrode 218b for introduction of high frequency, etc.

Also, the activation chamber (A) 202 was packed with solid C particles 204, heated by the electric furnace 203 to bring C into red hot state, whereinto $CF_4$ was blown through the inflow pipe 205 from a bomb not shown to form active species of $CF^{2*}$ which were then introduced into the film forming chamber 201 via the inflow pipe 206.

On the other hand, through the inflow pipe 217-1, respective gases of $Si_2H_6$ and $H_2$ were introduced into the film forming chamber 201. The $Si_2H_6$ gas and $H_2$ gas introduced were subjected to activation treatment such as plasma formation by means of the microwave plasma generating device 220 in the activation chamber (B) 219 to become activated hydrogenated silicon, activated hydrogen, which were then introduced through the inflow pipe 217-2 into the film forming chamber 201. During this operation, if desired, impurity gases such as $PH_3$, $B_2H_6$, etc. were also activated by introduction into the activation chamber (B) 219. Then, while maintaining the pressure in the film forming chamber 201 at 1.0 Torr, plasma generated from the discharging device 218 was allowed to act.

The aluminum cylinder 211 was heated to 220° C. by the heater 208, maintained thereat and rotated, while the discharging gas was discharged by controlling adequately the opening of the discharging valve 212. Thus, a photosensitive layer 13 was formed.

Also, the intermediate layer 12 was formed to a film thickness of 2000 Å by introducing a gas mixture of $H_2/B_2H_6$ (0.2% of $B_2H_6$ in terms of vol. %) through the inflow 217-1.

COMPARATIVE EXAMPLE 2

According to the plasma CVD method in general, an image forming member for electrophotography having a layer constitution as shown in FIG. 1 was formed by use of respective gases of $CF_4$, $Si_2H_6$, $H_2$ and $B_2H_6$ by means of the device having the same film forming chamber as the film forming chamber 201 provided with a high frequency means of 13.56MHz.

The conditions for preparation of the drum-shaped image forming members for electrophotography obtained in Example 10 and Comparative example 2 and their performances are shown in Table 2B.

EXAMPLE 11

By means of the device as shown in FIG. 3, with the use of $Si_2H_6$ as the silicon-containing compound, a PIN type diode as shown in FIG. 2 was prepared.

First, a polyethylenenaphthalate film 21 having ITO film 22 with a thickness of 1000 Å vapor deposited thereon was placed on a supporting stand and, after reduced to a pressure of $10^{-6}$ Torr, active species $CF_2^*$ formed similarly as in Example 6 was introduced through the inflow pipe 116 into the film forming chamber 101. Also, from the inflow pipe 110, $Si_2H_6$ at 150 SCCM and $PH_3$ gases (diluted to 1000 ppm with hydrogen gas) were respectively introduced into the activation chamber (B) 123 to be activated. Next, the activated gases were introduced through the inflow pipe 116 into the film forming chamber 101. While maintaining the pressure in the film forming chamber at 0.1 Torr, a n-type A-SiC(H,X) film 24 (film thickness 700 Å) doped with P was formed by the action of plasma from the discharging device.

Subsequently, by introducing $B_2H_6$ gas (diluted to 300 ppm with hydrogen gas) in place of $PH_3$ gas, following otherwise the same conditions as in the case of n-type A-SiC(H,X) film, an i-type A-SiC(H,X) film 25 (film thickness: 5000 Å) was formed.

Next, by use of $B_2H_6$ gas (diluted to 1000 ppm with hydrogen gas) together with $H_2$ gas, following otherwise the same conditions as in the case of n-type A-SiC(H,X) film 24, a p-type A-SiC(H,X) film 26 (film thickness: 700 Å) doped with B was formed. On this p-type film was further formed by vapor deposition an aluminum electrode 27 with a thickness of 1000 Å to provide a PIN type diode.

The diode element thus obtained (area 1 $cm^2$) was subjected to measurement of I-V characteristic, and rectifying characteristic and photovoltaic effect were evaluated. The results are shown in Table 3B.

Also, in photoirradiation characteristics, light was introduced from the substrate side, and a conversion efficiency of 8.5% or higher, an open circuit voltage of 0.92 V and a short circuit current of 10.5 mA/$cm^2$ were obtained at a photoirradiation intensity AMI (about 100 mW/$cm^2$).

EXAMPLES 12-14

Except for using straight $Si_4H_{10}$, branched $Si_4H_{10}$ or $H_6Si_6F_6$ in place of $Si_2H_6$, the same PIN type diode as in Example 11 was prepared. The rectifying characteristic and photovoltaic effect were evaluated and the results are shown in Table 3B.

From Table 3B, it can be seen that an A-SiC(H,X) PIN type diode having better optical and electrical characteristics as compared with the prior art can be obtained according to the present invention.

EXAMPLE 15

By means of the device as shown in FIG. 3, a carbon-containing amorphous deposited film was formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The heated substrate temperature is not particularly limited, but it should preferably be 30° to 450° C., more preferably 50° to 350° C., when the substrate is required to be heated in practicing the process of the present invention.

106 through 109 are gas feeding systems, and they are provided corresponding to carbon-containing compounds, and the kinds of gases optionally employed such as hydrogen, halogen compounds, inert gases and compounds containing impurity elements as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B) 123, and the active species (B) formed is introduced through the inflow pipe 124 into the film forming chamber 101. 111 is a gas pressure gauge.

In the drawing, 112 shows an activation chamber (A), 113 an electric furnace, 114 solid C particles and 115 a pipe for introduction of a gaseous compound containing carbon and halogen as the starting material for active species (A). The active species (A) formed in the activation chamber (A) 112 is introduced through the inflow pipe 116 into the film forming chamber 101.

117 is a discharging energy generating device and is provided with a matching box 117a, a cathode electrode 117b for introduction of high frequency, etc.

The discharging energy from the discharging energy generating device is irradiated on the active species flowing in the direction of the arrowhead 119, and the irradiated active species undergo mutually chemical reaction thereby to form a deposited film containing carbon on the whole or the desired portion of the substrate 103. In the drawing, 120 shows a gas discharging valve and 121 a gas discharging pipe.

First, a substrate 103 of polyethyleneterephthalate film was placed on a supporting stand 102, and the film forming chamber 101 was evacuated by use of an evacuating device (not shown) to about $10^{-6}$ Torr. From a gas feeding system 106, CH$_4$ gas at 150 SCCM was introduced into the activation chamber (B) 123 through the gas inflow pipe 110 at the substrate temperature shown in Table 1C. CH$_4$ gas, etc. introduced into the activation chamber (B) 123 were activated by means of the microwave plasma generating device 122 to be converted to activated carbon, activated hydrogen, etc., which were then introduced through the inflow pipe 124 into the film forming a chamber 101.

On the other hand, the activatiion chamber (A) 112 was packed with solid C particles 114, heated by the electric furnace 113 to be maintained at about 1000° C., thereby bringing C into red hot state, whereinto CF$_4$ was blown through the inflow pipe 115 from a bomb not shown, thus forming active species of CF$_2$*, which were then introduced into the film forming chamber 101 via the inflow pipe 116.

Thus, while maintaining the inner pressure in the film forming chamber 101 at 0.4 Torr, a carbon-containing amorphous deposited film (film thickness 700 Å) was formed by the action of plasma from the discharging device 117. The film forming speed was 36 Å/sec.

Subsequently, the sample having A-C(H,X) film formed thereon was placed in a vacuum deposition tank, wherein a comb-type Al-gap electrode (gap length 250 $\mu$, width 5 mm) was formed under vacuum of $10^{-5}$ Torr, and the dark electroconoductivity $\sigma_d$ was determined by measuring dark current at an application voltage of 10 V for evaluation of the film characteristics of the respective samples. The results are shown in Table 1C.

EXAMPLES 16-18

Except for using straight C$_2$H$_6$, C$_2$H$_4$ or C$_2$H$_2$ in place of CH$_4$, carbon-containing amorphous deposited films [A-C(H,X)] were formed in the same manner as in Example 15. The dark electroconductivities were measured to obtain the results shown in Table 1C.

From Table 1C, it can be seen that carbon-containing amorphous films excellent in electrical characteristics can be obtained according to the present invention.

EXAMPLE 19

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid C particles, 205 an inflow pipe for the starting material of active species (A), 206 a pipe for introducing active species (A), 207 a motor, 208 a heater which is used similarly as 104 in FIG. 3, 209 and 210 are blowing pipes, 211 an aluminum cylinder substrate, and 212 a gas discharging valve. 213 through 216 are starting gas feeding systems similarly as 106 through 109 in FIG. 3, and 217-1 is a gas introducing pipe.

In the film forming chamber 201, the aluminum cylinder 211 was suspended, equipped internally thereof with the heater 208 so as to be rotatable with the motor 207.

218 is a discharging energy generating device and is provided with a matching box 218a, a cathode electrode 218b for introduciton of high frequency, etc.

Also, the activation chamber (A) 202 was packed with solid C particles 204, heated by the electric furnace 203 to be maintained at about 1100° C. to bring C into red hot state, whereinto CF$_4$ was blown through the inflow pipe 205 from a bomb not shown to form active species of CF$^{2*}$, which was then introduced into the film forming chamber 201 via the inflow pipe 206.

On the other hand, through the inflow pipe 217-1, CH$_4$, Si$_2$H$_6$ and H$_2$ gases were introduced into the activation chamber (B) 219. The CH$_4$, Si$_2$H$_6$ and H$_2$ gas introduced were subjected to activation treatment such as plasma formation by means of the microwave plasma generating device 220 in the activation chamber (B) 219 to become activated carbon, activated silicon and activated hydrogen, which were then introduced through the inflow pipe 217-2 into the film forming chamber 201. During this operation, if desired, impurity gases such as $PH_3$, $B_2H_6$, etc. were also activated by introduction into the activation chamber (B) 219.

While maintaining the pressure in the film forming chamber 201 at 1.0 Torr, plasma was allowed to act from the discharging device.

The aluminum cylinder 211 was heated to 205° C. by the heater 208, maintained thereat and rotated, whlie the discharging gas was discharged by controlling adequately the opening of the discharging valve 212. Thus, a photosensitive layer 13 was formed.

Also, the intermediate layer 12 was formed to a film thickness of 2000 Å by introducing a gas mixture of $H_2/B_2H_6$ (0.2% of $B_2H_6$ in terms of vol. %) through the inflow pipe 217-1.

COMPARATIVE EXAMPLE 3

According to the plasma CVD method in general, an image forming member for electrophotography having a layer constitution as shown in FIG. 1 was formed by use of respective gases of $CF_4$, $CH_4$, $Si_2H_6$, $H_2$ and $B_2H_6$ by means of the device having the same film forming chamber as the film forming chamber 201 provided with a high frequency means of 13.56MHz.

The conditions for preparation of the drum-shaped image forming members for electrophotography obtained in Example 19 and Comparative example 3 and their performances are shown in Table 2C.

EXAMPLE 20

By means of the device as shown in FIG. 3, with the use of $CH_4$ as the carbon compound, a PIN type diode as shown in FIG. 2 was prepared.

First, a polyethylenenaphthalate film 21 having ITO film 22 with a thickness of 1000 Å vapor deposited thereon was placed on a supporting stand and, after reduced to a pressure of $10^{-6}$ Torr, active species $CF_2^*$, active species $SiF_2^*$ were introduced into the film forming chamber 101 similarly as in Example 15. Also, $Si_2H_6$ and $PH_3$ gases (diluted to 1000 ppm with hydrogen gas) were respectively introduced into the activation chamber (B) 123 to be activated. Then, the activated gases were introduced through the inflow pipe 116 into the film forming chamber 101. While maintaining the pressure in the film forming chamber at 0.1 Torr, plasma was allowed to act from the discharging device 117 to form a n-type A-SiC(H,X) film 24 (film thickness 700 Å) doped with P.

Next, according to the same method as in formation of the n-type A-SiC(H,X) film except for stopping introduction of $PH_3$ gas and increasing the value of $SiF_2^*/CF_2^*$ to three-fold, a non-doped A-SiC(H,X) film 25 (film thickness: 5000 Å) was formed.

Subsequently, by introducing $CH_4$ and $B_2H_6$ gas (diluted to 1000 ppm with hydrogen gas) together with $Si_2H_6$ gas, following otherwise the same conditions as in the case of n-type, an A-SiC(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 cm²) was subjected to measurement of I–V characteristic, and rectifying characteristic and photovoltaic effect were evaluated. The results are shown in Table 3C.

Also, in photoirradiation characteristics, light was introduced from the substrate side, and a conversion efficiency of 7.6% or higher, an open circuit voltage of 0.93 V and a short circuit current of 11.0 mA/cm² wree obtained at a photoirradiation intensity AMI (about 100 mW/cm²).

EXAMPLES 21-23

Except for using $C_2H_6$, $C_2H_4$ or $C_2H_2$ in place of $CH_4$ as the carbon compound, the same PIN type diodes as in Example 20 were prepared in the same manner as in Example 20. The rectifying characteristic and photovoltaic effect were evaluated and the results are shown in Table 3C.

From Table 3C, it can be seen that an amorphous semiconductor PIN type diode having better optical and electrical characteristics as compared with the prior art can be obtained according to the present invention.

EXAMPLE 24

By mans of the device as shown in FIG. 3, i-type, p-type and n-type A-Ge(C,H,X) deposited films were formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The substrate temperature is not particularly limited, but when the substrate is required to be heated in practicing the process of the present invention, the substrate temperature may be preferably 30° to 450° C., more preferably 50° to 350° C.

106 through 109 are gas feeding systems, and they are provided corresponding to germanium-containing compounds, and the kinds of gases optionally employed such as hydrogen, halogen compounds, inert gases, silicon-containing compounds, carbon-containing compounds and compounds containing impurity elements as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid C particles and 115 a pipe for introduction of a gaseous compound containing carbon and halogen as the starting material for active species (A). The active species (A) formed in the activation chamber 112 is introduced through the inflow pipe 116 into the film forming chamber 101.

117 is a discharging energy generating device and is provided with a matching box 117a, a cathode electrode 117b for introduction of high frequency, etc.

The discharging energy from the discharging energy generating device is allowed to act on the active species flowing in the direction of the arrowhead 119, and the active species subjected to the action undergo mutually chemical reaction thereby to form a deposited film of A-Ge(C,H,X) on the whole or the desired portion of the substrate 103. In the drawing, 120 shows a gas discharging valve and 121 a gas discharging pipe.

First, a polyetheneterephthalate film 103 was placed on a supporting stand 102, and the film forming chamber 101 was evacuated by use of an evacuating device to about $10^{-6}$ Torr. From a gas feeding source 106, GeH$_4$ gas at 150 SCCM, or a gas mixture thereof with PH$_3$ gas or B$_2$H$_6$ gas (each diluted to 1000 ppm with hydrogen gas) at 40 SCCM was introduced into the activation chamber (B) 123 through the gas inflow pipe 110. GeH$_4$ gas, etc. introduced into the activation chamber (B) 123 was activated by means of the microwave plasma generating device 122 to be converted to activated hydrogenated germanium species, etc., which were then introduced through the inflow pipe 124 into the film forming chamber 101.

On the other hand, the activation chamber (A) 122 was packed with solid C particles 114, heated by the electric furnace 113 to be maintained at about 1100° C., thereby bringing C into red hot state, whereinto CF$_4$ was blown through the inflow pipe 115 from the bomb not shown, thus forming active species of CF$_2$*, which were then introduced into the film forming chamber 101 via the inflow pipe 116.

While maintaining the inner pressure in the film forming chamber 101 at 0.4 Torr, plasma was allowed to act from the discharging device 117 to form a non-doped or doped A-Ge(C,H,X) film (film thickness 700 Å), respectively. The film forming rate was 25 Å/sec.

Subsequently, the non-doped or p-type A-SiGe(H,X) film sample obtained was placed in a vacuum deposition tank, wherein a comb-type Al-gap electrode (gap length 250 μ, width 5 mm) was formed under vacuum of $10^{-5}$ Torr, and the dark electroconductivity $\sigma_d$ was determined by measuring dark current at an applied voltage of 10 V for evaluation of the film characteristics of the respective samples. The results are shown in Table 1D.

EXAMPLES 25-27

Except for using straight chain Ge$_4$H$_{10}$, branched Ge$_4$H$_{10}$, or H$_6$Ge$_6$F$_6$ in place of GeH$_4$, A-Ge(C,H,X) films were formed in the same manner as in Example 24. The dark electroconductivities were measured to obtain the results shown in Table 1D.

From Table 1D, it can be seen that A-Ge(C,H,X) films excellent in electrical characteristics can be obtained and, also A-Ge(C,H,X) films subjected to satisfactory doping can be obtained according to the present invention.

EXAMPLE 28

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid Si particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 1, and 217-1 is a gas introducing pipe.

In the film forming chamber 201, the aluminum cylinder 211 is suspended, equipped internally thereof with the heater 208 so as to be rotatable with the motor 207. 218 is a discharging energy generating device, and discharging energy 219 is irradiated toward the desired portion of the film forming surface on the aluminum cylinder 211.

Also, the activation chamber (A) 202 is packed with solid C particles 204, heated by the electric furnace 203 to be maintained at about 1100° C. to bring C into red hot state, whereinto CF$_4$ is blown to form active species of CF$_2$*, which are then introduced into the film forming chamber 201 via the inflow pipe 206.

On the other hand, through the inflow pipe 217-1, Si$_2$H$_6$, GeH$_4$ and H$_2$ gases are introduced into the activation chamber (B) 219. The Si$_2$H$_6$, GeH$_4$ and H$_2$ gas introduced are subjected to activation treatment such as plasma formation by means of the microwave plasma generating device 220 in the activation chamber (B) 219 to become hydrogenated silicon active species, hydrogenated germanium species and activated hydrogen, which are then introduced through the inflow pipe 217-2 into the film forming chamber 201. During this operation, if desired, impurity gases such as PH$_3$, B$_2$H$_6$, etc. are also activated by introduciton into the activation chamber (B) 219.

Then, while maintaining the pressure in the film forming chamber 201 at 1.0 Torr, plasma generated from the discharging device 218 is allowed to act.

The aluminum cylinder 211 is rotated, whlie the discharging gas is discharged by controlling the opening of the discharging valve 212. Thus, a photosensitive layer 13 is formed.

Also, the intermediate layer 12 is formed before formation of the photosensitive layer 13 to a film thickness of 2000 Å by introducing gases of Si$_2$H$_6$, GeH$_4$, H$_2$ and B$_2$H$_6$ (0.2% of B$_2$H$_6$ in terms of vol. %) through the inflow pipe 217-1.

COMPARATIVE EXAMPLE 4

According to the plasma CVD method of prior art, an image forming member for electrophotography having a layer constitution as shown in FIG. 1C was formed by use of respective gases of CF$_4$ and Si$_2$H$_6$, GeH$_4$, H$_2$ and B$_2$H$_6$ by means of the device having the same film forming chamber as the film forming chamber 201 provided with a high frequency means of 13.56 MHz.

The conditions for preparation of the drum-shaped image forming members for electrophotography obtained in Example 28 and Comparative example 4 and their performances are shown in Table 2D.

EXAMPLE 29

By means of the device as shown in FIG. 3, with the use of GeH$_4$ as the germanium-containing compound, a PIN type diode as shown in FIG. 2 was prepared.

First, a polyethenenaphthalate film 21 having ITO film 22 with a thickness of 1000 Å vapor deposited thereon was placed on a supporting stand and, after reduced to a pressure of $10^{-6}$ Torr, active species CF$_2$*, active species SiF$_2$* formed similarly as in Example 24 were introduced into the film forming chamber 101. Also, Si$_2$H$_6$ gas, GeH$_4$ gas and PH$_3$ gas (diluted to 1000 ppm with hydrogen gas) were respectively introduced into the activation chamber (B) 123 to be activated.

Then, the activated gases were introduced through the inflow pipe 116 into the film forming chamber 101. While maintaining the pressure in the film forming chamber at 0.1 Torr, plasma was allowed to act from the discharging device 117 to form a n-type A-SiGeC(H,X) film 24 (film thickness 700 Å) doped with P.

Next, according to the same method as in formation of the n-type A-SiGeC(H,X) film except for introduciton of $B_2H_6$ gas (diluted to 300 ppm with hydrogen gas) in place of $PH_3$ gas, an i-type A-SiGeC(H,X) film 25 (film thickness: 5000 Å) was formed.

Subsequently, by using $B_2H_6$ gas (diluted to 1000 ppm with hydrogen gas) in place of $PH_3$ gas, following otherwise the same conditions as in the case of n-type, an A-SiGeC(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 $cm^2$) was subjected to measurement of I-V characteristic, and rectifying characteristic and photovoltaic effect were evaluated. The results are shown in Table 3D.

Also, in photoirradiation characteristics, light was introduced from the substrate side, and a conversion efficiency of 7.0% or higher, an open circuit voltage of 0.89 V and a short circuit current of 10 mA/$cm^2$ were obtained at a photoirradiation intensity AMI (about 100 mW/$cm^2$).

EXAMPLES 30-32

Except for using straight chain $Ge_4H_{10}$, branched $Ge_4H_{10}$ or $H_6Ge_6F_6$ in place of $GeH_4$ as the germanium-containing compound, the same PIN type diode as in Example 29 was prepared in the same manner as in Example 29. The rectifying characteristic and photovoltaic effect were evaluated and the results are shown in Table 3D.

From Table 3D, it can be seen that an A-SiGeC(H,X) PIN type diode having better optical and electrical characteristics as compared with the prior art can be obtained according the the present invention.

EXAMPLE 33

By means of the device as shown in FIG. 3, amorphous deposited films were formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The substrate temperature is not particularly limited, but when the substrate is required to be heated in practicing the process of the present invention, the substrate temperature may be preferably 30° to 450° C., more preferably 50° to 300° C.

106 through 109 are gas feeding systems, and they are provided corresponding to the kinds of gases for film formation, gases optionally employed such as hydrogen, halogen compounds, inert gases, silicon-containing compounds, carbon-containing compounds, germanium-containing compounds, and gases of compounds containing impurity elements as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid C particles and 115 a pipe for introduction of a gaseous compound containing carbon and halogen as the starting material for active species (A). The active species (A) formed in the activation chamber 112 is introduced through the inflow pipe 116 into the film forming chamber 101.

117 is a discharging energy generating device and is provided with a matching box 117a, a cathode electrode 117b for introduciton of high frequency, etc.

The discharging energy from the discharging energy generating device is allowed to act on the active species flowing in the direction of the arrowhead 119, and the active species subjected to the action undergo mutually chemical reaction thereby to form an amorphous deposited film on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device to about $10^{-6}$ Torr. At the substrate temperature indicated in Table 1E, gasified disiloxane at 150 SCCM from the bomb for gas feeding 106 was introduced into the activation chamber (B) 123 through the gas inflow pipe 110 with or without $PH_3$ gas or $B_2H_6$ gas (each diluted to 1000 ppm with hydrogen gas) at 40 SCCM. Disiloxane introduced into the activation chamber (B) 123 was activated by means of the microwave plasma generating device 122 to be converted to activated disiloxane, which was then introduced through the inflow pipe 124 into the film forming chamber 101.

On the other hand, the activation chamber (A) 112 was packed with solid carbon particles 114, heated by the electric furnace 113 to be maintained at about 1000° C., thereby bringing carbon into red hot state, whereinto $CF_4$ was blown through the inflow pipe 115, thus forming active species of $CF_2^*$, which were then introduced into the film forming chamber 101 via the inflow pipe 116.

While maintaining the inner pressure in the film forming chamber 101 at 0.3 Torr, plasma was allowed to act from the discharging device to form an A-SiOC(H,X) film (film thickness 700 Å). The film forming speed was 35 Å/sec.

Subsequently, the A-SiOC(H,X) film obtained was placed in a vacuum deposition tank, wherein a comb-type Al-gap electrode (gap length 250 $\mu$, width 5 mm) was formed undre vacuum of $10^{-5}$ Torr, and the dark electroconductivity $\sigma_d$ was determined by measuring dark current at an applied voltage of 15 V for evaluation of the film characteristics of the respective samples. The results are shown in Table 1E.

EXAMPLE 34

Except for using $H_3SiOSiH_3/H_2/F_2$ gases (gas ratio: $H_3SiOSiH_3/H_2/F_2 = 10:10:13$), A-SiOC(H,X) films were formed according to the same method and procedures as in Example 33. The dark electroconductivities were measured for respective samples to obtain the results shown in Table 1E.

From Table 1E, it can be seen that amorphous deposited films excellent in electrical characteristics can be obtained according to the present invention.

EXAMPLE 35

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid carbon particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 1, and 217-1 is a gas introducing pipe.

In the film forming chamber 201, the aluminum cylinder 211 is suspended, equipped internally thereof with the heater 208 so as to be rotatable with the motor 207. 218 is a discharging energy generating device and is provided with a matching box 218a, a cathode electrode 218b for introduction of high frequency, etc.

Also, the activation chamber (A) 202 is packed with solid C particles 204, heated by the electric furnace 203 to be maintained at about 1000° C. to bring C into red hot state, whereinto $CF_4$ is blown to form active species of $CF_2^*$, which are then introduced into the film forming chamber 201 via the inflow pipe 206. From the activation chamber (C) (not shown) having the same structure as the activation chamber (A) 202, activated species (c) of $SiF_2^*$ from solid Si particles and $SiF_4$ was introduced in the same manner.

On the other hand, through the inflow pipe 217-1, gasified disiloxane were introduced into the activation chamber (B) 219. The disiloxane gas introduced was subjected to activation treatment such as plasma formation by means of the microwave plasma generating device 220 in the activation chamber (B) 219 to become activated disiloxane, which was then introduced through the inflow pipe 217-2 into the film forming chamber 201. During this operation, if desired, impurity gases such as $PH_3$, $B_2H_6$, etc. were also activated by introduction into the activation chamber (B) 219.

The aluminum cylinder 211 was heated to 220° C. by the heater 208, maintained thereat and rotated, while the discharging gas was discharged by controlling adequately the opening of the discharging valve 212. Thus, an intermediate layer 12 was formed to a film thickness of 2000 Å.

The photosensitive layer 13 was formed to a film thickness of 2000 Å without use of $CF_4$ of the gases used for formation of the intermediate layer 12, using also $H_2$ gas in place of disiloxane, by introducing a gas mixture of $H_2/B_2H_6$ (0.2% of $B_2H_6$ in terms of vol. %) through the inflow pipe 217-1, following otherwise the same procedures as in the case of the intermediate layer 12.

COMPARATIVE EXAMPLE 5

According to the plasma CVD method in general, an image forming member for electrophotography having a layer constitution as shown in FIG. 1 was formed by use of respective gases of $CF_4$, $SiF_4$, disiloxane, $H_2$ and $B_2H_6$ by means of the device having the same film forming chamber as the film forming chamber 201 provided with a high frequency means of 13.56 MHz.

The conditions for preparation of the drum-shaped image forming members for electrophotography obtained in Example 35 and Comparative example 5 and their performances are shown in Table 2E.

EXAMPLE 36

By means of the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $SiF_2^*$ formed similarly as in Example 35 were introduced into the film forming chamber 101. Also, $H_2$ gas and $PH_3$ gas (diluted to 1000 ppm with hydrogen gas) were respectively introduced into the activation chamber (B) 123 to be activated. Then, the activated gases were introduced through the inflow pipe 116 into the film formign chamber 101. While maintaining the pressure in the film forming chamber at 0.1 Torr, plasma was allowed to act from the discharging device to form a n-type A-Si(H,X) film 24 (film thickness 700 Å) doped with P.

Next, according to the same method as in formation of the n-type A-Si(H,X) film except for stopping introduciton of $PH_3$ gas and using $SiF_2^*/CF_2^*$, a non-doped A-Si(H,X) film 25 (film thickness: 5000 Å) was formed.

Subsequently, by using $B_2H_6$ gas (diluted to 1000 ppm with hydrogen gas) together with $H_3SiOSiH_3/H_2$ gas (mixing ratio 1:10) in place of $H_2/PH_3$ gas, following otherwise the same conditions as in the case of n-type, a p-type A-SiO(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 $cm^2$) was subjected to measurement of I-V characteristic, and rectifying characteristic and photovoltaic effect were evaluated. The results are shown in Table 3E.

Also, in photoirradiation characteristics, light was introduced from the substrate side, and a conversion efficiency of 8.0% or higher, an open circuit voltage of 0.82 V and a short circuit current of 10 mA/$cm^2$ were obtained at a photoirradiation intensity AMI (about 100 mW/$cm^2$).

EXAMPLE 37

Except for using $H_3SiOSiH_3/H_2/F_2$ gases (ratio=1:15:2) in place of $H_3SiOSiH_3/H_2$ gas, the same diode as in Example 36 was prepared in the same manner as in Example 36. The rectifying characteristic and photovoltaic effect were evaluated and the results are shown in Table 3E.

EXAMPLE 38

By means of the device as shown in FIG. 3, amorphous deposited films were formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The substrate temperature is not particularly limited, but when the substrate is required to be heated in practicing the process of the present invention, the substrate temperature may be preferably 30° to 450° C., more preferbaly 50° to 300° C.

106 through 109 are gas feeding systems, and they are provided corresponding to the starting gases for film formation, and the kinds of gases optionally employed such as inert gases, and compounds containing impurity elements as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid carbon particles and 115 a pipe for introduction of a gaseous compound containing carbon and halogen as the starting material for active species (A). The active species (A) formed in the activation chamber 112 is introduced through the inflow pipe 116 into the film forming chamber 101.

117 is a discharging energy generating device and is provided with a matching box 117a, a cathode electrode 117b for introduciton of high frequency, etc.

The discharging energy from the discharging energy generating device 117 is allwoed to act on the active species flowing in the direction of the arrowhead 119, and the active species subjected to the action undergo mutually chemical reaction thereby to form a deposited film on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device to about $10^{-6}$ Torr. Gasified triethylsilazane from the bomb for gas feeding 106 was introduced into the activation chamber (B) 123 through the gas inflow pipe 110. Triethylsilazane, etc. introduced into the activation chamber (B) 123 was activated by means of the microwave plasma generating device 122 to be converted to activated triethylsilazane, which was then introduced through the inflow pipe 124 into the film forming chamber 101.

On the other hand, the activation chamber (A) 122 was packed with solid carbon particles 114, heated by the electric furnace 113 to be maintained at about 1000° C., thereby bringing carbon into red hot state, whereinto CF$_4$ was blown through the inflow pipe 115 from the bomb not shown, thus forming active species of CF$_2$*, which were then introduced into the film forming chamber 101 via the inflow pipe 116.

Thus, while maintaining the inner pressure in the film forming chamber 101 at 0.6 Torr, plasma was allowed to act from the discharging device 117 to form an A-SiNC(H,X) film (film thickness 700 Å). The film forming speed was 51 Å/sec.

Subsequently, the A-SiNC(H,X) film obtained was placed in a vacuum deposition tank, wherein a comb-type Al-gap electrode (gap length 250 μ, width 5 mm) was formed under vacuum of $10^{-5}$ Torr, and the dark electroconductivity $\sigma_d$ was determined by measuring dark current at an applied voltage of 12 V for evaluation of the film characteristics of the respective samples. The results are shown in Table 1F.

EXAMPLE 39

Except for using (C$_2$H$_5$)$_3$SiNH$_2$/H$_2$/F$_2$ (gas ratio = 8:8:1) in place of triethylsilazane gas from the gas feeding bomb 106, etc., A-SiNC(H,X) film was formed according to the same method and procedures as in Example 38. The dark electroconductivities were measured for respective samples to obtain the results shown in Table 1F.

From Table 1F, it can be seen tha amorphous films excellent in electrical characteristics can be obtained according to the present invention.

EXAMPLE 40

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid carbon particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 1, and 217-1 is a gas introducing pipe.

In the film forming chamber 201, the aluminum cylinder 211 is suspended, equipped internally thereof with the heater 208 so as to be rotatable with the motor 207. 218 is a discharging energy generating device and is provided with a matching box 218a, a cathode electrode 218b for introduction of high frequency, etc.

Also, the activation chamber (A) 202 is packed with solid C particles 204, heated by the electric furnace 203 to be maintained at about 1000° C. to bring C into red hot state, whereinto CF$_4$ is blown into to form active species of CF$_2$*, which are then introduced into the film forming chamber 201 via the inflow pipe 206. Further, from the activation chamber (C) (not shown) having the same structure as the activation chamber (A), activated species (C) of SiF$_2$* from solid Si particles and SiF$_4$ was introduced in the same manner.

On the other hand, through the inflow pipe 217-1, gasified triethylsilazane was introduced into the activation chamber (B) 219. The triethylsilazane gas introduced was subjected to activation treatment such as plasma formation by means of the microwave plasma generating device 220 in the activation chamber (B) 219 to become activated triethylsilazane, which was then introduced through the inflow pipe 217-2 into the film forming chamber 201. During this operation, if desired, impurity gases such as $PH_3$, $B_2H_6$, etc. were also introduced into the activation chamber (B) 219. Then, while maintaining the pressure in the film forming chamber 201 at 1.0 Torr, plasma generated from the discharging device 218 was allowed to act.

The aluminum cylinder 211 was rotated, while the discharging gas was discharged by controlling adequately the opening of the discharging valve 212. Thus, an intermediate layer 12 was formed to a film thickness of 2000 Å.

Also, the photosensitive layer 13 was formed to a film thickness of 2000 Å without use of $CF_4$ of the gases used for formation of the intermediate layer 12, using also $H_2$ gas in place of triethylsilazane, by introducing a gas mixture of $H_2/B_2H_6$ (0.2% of $B_2H_6$ in terms of vol. %) through the inflow pipe 217-1, following otherwise the same procedures as in the case of the intermediate layer 12.

COMPARATIVE EXAMPLE 6

According to the plasma CVD method of prior art, an image forming member for electrophotography having a layer constitution as shown in FIG. 1 was formed by use of respective gases of $CF_4$, $SiF_4$, triethylsilazane, $H_2$ and $B_2H_6$ by means of the device having the same film forming chamber as the film forming chamber 201 provided with a high frequency means of 13.56 MHz.

The conditions for preparation of the drum-shaped image forming members for electrophotography obtained in Example 40 and Comparative example 6 and their performances are shown in Table 2F.

EXAMPLE 41

By means of the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $SiF_2^*$ formed similarly as in Example 40 were introduced into the film forming chamber 101. Also, $H_2$ gas and $PH_3$ gas (diluted to 1000 ppm with hydrogen gas) were respectively introduced into the activation chamber (B) 123 to be activated. Then, the activated gases were introduced through the inflow pipe 116 into the film forming chamber 101. While maintaining the pressure in the film forming chamber at 0.1 Torr, plasma was allowed to act from the discharging device 117 to form a n-type A-Si(H,X) film 24 (film thickness 700 Å) doped with P.

Next, according to the same method as in formation of the n-type A-Si(H,X) film except for stopping introduction of $PH_3$ gas and using the value of $SiF_2^*/CF_2^*$, a non-doped A-Si(H,X) film 25 (film thickness: 5000 Å) was formed.

Subsequently, by uisng $B_2H_6$ gas (diluted to 1000 ppm with hydrogen gas) together with $(C_2H_5)_3SiNH_2/H_2$ gas (mixing ratio 1:10) in place of $H_2/PH_3$ gas, following otherwise the same conditions as in the case of n-type, a p-type A-SiNC(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 cm$^2$) was subjected to measurement of I–V characteristic, and rectifying characteristic and photovoltaic effect were evaluated. The results are shown in Table 3F.

Also, in photoirradiation characteristics, light was introduced form the substrate side, and a conversion efficiency of 9.0% or higher, an open circuit voltage of 0.92 V and a short circuit current of 10 mA/cm$^2$ were obtained at a photoirradiation intensity AMI (about 100 mW/cm$^2$).

EXAMPLE 42

Except for using $(C_2H_5)_3SiNH_2/H_2/F_2$ gases (ratio=1:15:2) in place of $(C_2H_5)_3SiNH_2/H_2$ gases, the same diode as in Example 41 was prepared in the same manner as in Example 41. The rectifying characteristic and photovoltaic effect were evaluated and the results are shown in Table 3F.

TABLE 1A

|  | Example 1 | Example 2 |
|---|---|---|
| Gas for Forming active species (B) | $H_2$ | $H_2F_2$ |
| Substrate temperature (°C.) | 200 | 200 |
| $\sigma_d (\Omega \cdot cm)^{-1}$ | $6.7 \times 10^{-10}$ | $4.3 \times 10^{-10}$ |

TABLE 2A

|  | Example 3 | Comparative Example 1 |
|---|---|---|
| Gas for forming active species (A) | $CF_4$ | |
| Activation temperature | 1100° C. | |
| Main active species | $CF_2^*$ $SiF_2^*$ | |
| Gas for forming active species (B) | $H_2$ | |
| Inflow amount from activation chamber (A) | 200 SCCM | |
| Inflow amount from activation chamber (B) | 100 SCCM | |
| Inflow amount from gas bomb | | $CF_4$ 50 SCCM $SiF_4$ 100 SCCM $SiH_4$ 100 SCCM $H_2$ 100 SCCM |
| Inner pressure in film forming chamber | 0.8 Torr. | 1.0 Torr. |
| Substrate temperature | 220° C. | 280° C. |
| Film forming speed | 38 Å/sec | 7 Å/sec |
| RF discharging power | 0.2 W/cm$^2$ | 1.7 W/cm$^2$ |
| Layer thickness of photosensitive layer | 24 μ | 24 μ |
| Average number of image ddefects in 10 drum-shaped image forming members for electro-photography | 5 | 17 |
| Acceptance potential irregularity in circumferential | ±10 V | ±30 V |
| Acceptance potential irregularity in axial direction | ±10 V | ±35 V |
| Remarks | Example according to the process of the invention | Example according to plasma CVD of prior art |

TABLE 3A

|  | Example 4 | Example 5 |
|---|---|---|
| Gas for forming active species (B) | $H_2$ | $H_2/F_2$ |
| Substrate temperature (°C.) | 220 | 220 |
| Rectifying ratio of diode (*1) | $7 \times 10^2$ | $9 \times 10^2$ |
| n value of diode | 1.2 | 1.3 |

TABLE 3A-continued

|  | Example 4 | Example 5 |
|---|---|---|
| (*2) |  |  |

*1 Ratio of forward current to backward current at voltage 1 V
*2 n value (Quality Factor) in the current formula of p-n junction:

$$J = J_S \left\{ \exp\left(\frac{eV}{RT}\right) - 1 \right\}$$

TABLE 1B

|  | Example 6 | Example 7 | Example 8 | Example 9 |
|---|---|---|---|---|
| Gas for forming active species (B) | $SiH_4$ | $Si_2H_6$ | $SiH_3SiH(SiH_3)SiH_3$ | $H_6Si_6F_6$ |
| Substrate temperature (°C.) | 210 | 220 | 210 | 210 |
| $\sigma_d$ (Non-doped) $(\Omega \cdot cm)^{-1}$ | $7.9 \times 10^{-11}$ | $4.5 \times 10^{-11}$ | $5.3 \times 10^{-11}$ | $3 \times 10^{\times 11}$ |
| $\sigma_d$ (B doped) $(\Omega \cdot cm)^{-1}$ | $7.1 \times 10^{-10}$ | $2.8 \times 10^{-10}$ | $4.1 \times 10^{-10}$ | $4 \times 10^{-10}$ |
| $\sigma_d$ (P doped) $(\Omega \cdot cm)^{-1}$ | $5.0 \times 10^{-9}$ | $4.5 \times 10^{-9}$ | $4.8 \times 10^{-9}$ | $3.9 \times 10^{-9}$ |

TABLE 2B

|  | Example 10 | Comparative example 2 |
|---|---|---|
| Gas for forming active species (A) | $CF_4$ |  |
| Activation | 1100 °C. |  |
| Main active species | $CF_2^*$ |  |
| Gas for forming active species (B) | $Si_2H_6/H_2$ |  |
| Inflow amount from activation chamber (A) | 200 SCCM |  |
| Inflow amount from activation chamber (B) | 100 SCCM |  |
| Inflow amount from gas bomb |  | $CF_4$ 200 SCCM $Si_2H_6$ 100 SCCM $H_2$ 100 SCCM |
| Inner pressure in film forming chamber | 1.0 Torr. | 1.0 Torr. |
| Substrate temperature |  | 280° C. |
| Film forming speed | 15 Å/sec | 5 Å/sec |
| RF discharging power | 60 W | 130 W |
| Layer thickness of photosensitive layer 13 | 22μ | 22μ |
| Average number of image defects in 10 drum-shaped image forming members for electrophotography | 2 | 15 |
| Acceptance potential irregularity in circumferential | ±10 V | ±30 V |
| Acceptance potential irregularity in axial direction | ±15 V | ±35 V |
| Remarks | Example according to the process of the invention | Example according to plasma CVD of prior art |

TABLE 3B

|  | Example 11 | Example 12 | Example 13 | Example 14 |
|---|---|---|---|---|
| Film forming starting gas | $Si_2H_6$ | $Si_4H_{10}$ | $SiH_3SiH(SiH_3)SiH_3$ | $H_6Si_6F_6$ |
| Substrate temperature (°C.) | 220 | 220 | 230 | 230 |
| Rectifying ratio of diode (*1) | $8 \times 10^2$ | $8 \times 10^2$ | $7 \times 10^2$ | $8.5 \times 10^2$ |
| n value of diode (*2) | 1.3 | 1.3 | 1.4 | 1.25 |

*1 : Ratio of forward current to backward current at voltage 1 V
*2 : n value (Quality Factor) in the current formula of p-n junction:

$$J = JS \left\{ \exp\left(\frac{eV}{nRT}\right) - 1 \right\}$$

TABLE 1C

|  | Example 15 | Example 16 | Example 17 | Example 18 |
|---|---|---|---|---|
| Gas for forming active species (B) | $CH_4$ | $C_2H_6$ | $C_2H_4$ | $C_2H_2$ |
| Substrate temperature (°C.) | 200 | 220 | 210 | 210 |
| $\sigma_d (\Omega \cdot cm)^{-1}$ | $9.0 \times 10^{-11}$ | $3.7 \times 10^{-11}$ | $5.0 \times 10^{-11}$ | $3.1 \times 10^{-11}$ |

TABLE 2C

|  | Example 19 | Comparative example 3 |
|---|---|---|
| Gas for forming active species (A) | $CF_4$ |  |
| Activation temperature | 1100 °C. |  |
| Main active species | $CF_2$* |  |
| Gas for forming active species (B) | $CH_4/Si_2H_6/H_2$ (Volume ratio 0.1:2:1) |  |
| Inflow amount from activation chamber (A) | 220 SCCM |  |
| Inflow amount from activation chamber (B) | 110 SCCM |  |
| Inflow amount from gas bomb |  | $SiF_4$ 200 SCCM $CH_4$ 50 SCCM $SiH_4$ 100 SCCM $H_2$ 100 SCCM |
| Inner pressure in film forming chamber | 1.0 Torr. | 1.0 Torr. |
| Substrate temperature | 205 °C. | 260 °C. |
| Film forming speed | 31 Å/sec | 5 Å/sec |
| RF discharging power | 0.1 W/cm$^2$ | 1.7 W/cm$^2$ |
| Layer thickness of photosensitive layer 13 | 26μ | 26μ |
| Average number of image defects in 10 drum-shaped image forming members for electrophotography | 5 | 21 |
| Acceptance potential irregularity in circumferential | ±15 V | ±30 V |
| Acceptance potential irregularity in axial direction | ±15 V | ±35 V |
| Remarks | Example according to the process of the invention | Example according to plasma CVD of prior art |

TABLE 3C

|  | Example 20 | Example 21 | Example 22 | Example 23 |
|---|---|---|---|---|
| Gas for forming active species (B) | $CH_4$ | $C_2H_6$ | $C_2H_4$ | $C_2H_2$ |
| Rectifying ratio of diode (*1) | 6 × 10$^2$ | 7 × 10$^2$ | 6.5 × 10$^2$ | 8.1 × 10$^2$ |
| n value of diode (*2) | 1.3 | 1.2 | 1.25 | 1.23 |

*1 Ratio of forward current to backward current at voltage 1 V
*2 n value (Quality Factor) in the current formula of p-n junction:

$$J = J_s \left\{ \exp\left(\frac{eV}{nRT}\right) - 1 \right\}$$

TABLE 1D

|  | Example 24 | Example 25 | Example 26 | Example 27 |
|---|---|---|---|---|
| Gas for forming active species (B) | $GeH_4$ | Straight chain $Ge_4H_{10}$ | Branched $Ge_4H_{10}$ | $H_6Ge_6F_6$ |
| Substrate temperature (°C.) | 200 | 210 | 205 | 220 |
| $\sigma_d$ (Non-doped) $(\Omega \cdot cm)^{-1}$ | 8.7 × 10$^{-8}$ | 6.5 × 10$^{-8}$ | 7.7 × 10$^{-8}$ | 5.3 × 10$^{-8}$ |
| $\sigma_d$ (B doped) $(\Omega \cdot cm)^{-1}$ | 4.6 × 10$^{-7}$ | 2.6 × 10$^{-7}$ | 4.8 × 10$^{-7}$ | 6.4 × 10$^{-7}$ |
| $\sigma_d$ (P doped) $(\Omega \cdot cm)^{-1}$ | 4.3 × 10$^{-6}$ | 5.6 × 10$^{-6}$ | 7.1 × 10$^{-6}$ | 3.8 × 10$^{-6}$ |

TABLE 2D

|  | Example 28 | Comparative example 4 |
|---|---|---|
| Gas for forming active species (A) | $CF_4$ |  |
| Activation temperature | 1100° C. |  |
| Main active species | $CF_2$* |  |
| Gas for forming active species (B) | $Si_2H_6/GeH_4/H_2$ |  |
| Inflow amount from activation chamber (A) | 200 SCCM |  |
| Inflow amount from activation chamber (B) | 100 SCCM |  |
| Inflow amount from |  | $CF_4$ 200 SCCM |

TABLE 2D-continued

|  | Example 28 | Comparative example 4 |
|---|---|---|
| gas bomb |  | Si$_2$H$_6$ 100 SCCM<br>GeH$_4$ 50 SCCM<br>H$_2$ 100 SCCM |
| Inner pressure in film forming chamber | 1.0 Torr. | 1.0 Torr. |
| Film forming speed | 19 Å/sec | 5 Å/sec |
| RF discharging power |  | 1.6 W/cm$^2$ |
| Layer thickness of photosensitive layer 13 | 22μ | 22μ |
| Average number of image defects in 10 drum-shaped image forming members for electrophotography | 3 | 20 |
| Acceptance potential irregularity in circumferential | ±12 V | ±35 V |
| Acceptance potential irregularity in axial direction | ±17 V | ±39 V |
| Remarks | Example according to the process of the invention | Example according to plasma CVD of prior art Substrate temperature 250° C. |

TABLE 3D

|  | Example 29 | Example 30 | Example 31 | Example 32 |
|---|---|---|---|---|
| Gas for forming active species (B) | GeH$_4$ | Straight chain Ge$_4$H$_{10}$ | Branched Ge$_4$H$_{10}$ | H$_6$Ge$_6$F$_6$ |
| Substrate temperature (°C.) | 210 | 220 | 215 | 225 |
| Rectifying ratio of diode (*1) | 6.8 × 10$^2$ | 5.5 × 10$^2$ | 7.2 × 10$^2$ | 7.1 × 10$^2$ |
| n value of diode (*2) | 1.3 | 1.4 | 1.38 | 1.28 |

*1 Ratio of forward current to backward current at voltage 1 V
*2 n value (Quality Factor) in the current formula p-n junction:

$$J = J_s \left\{ \exp\left(\frac{eV}{nRT}\right) - 1 \right\}$$

TABLE 1E

|  | Example 33 | Example 34 |
|---|---|---|
| Gas for forming active species (B) | H$_3$SiOSiH$_3$ | H$_3$SiOSi$_3$/H$_2$/F$_2$ |
| Substrate temperature (°C.) | 200 | 200 |
| $\sigma_d$ (Ω · cm)$^{-1}$ | 7.3 × 10$^{-8}$ | 8.1 × 10$^{-8}$ |

TABLE 2E

|  | Example 35 | Comparative example 5 |
|---|---|---|
| Gas for forming active species (A) | CF$_4$/SiF$_4$ |  |
| Activation temperature | 1000° C. |  |
| Main active species | CF$_2$* SiF$_2$* |  |
| Gas for forming active species (B) | Disiloxane H$_2$ |  |
| Inflow amount from activation chamber (A) | 200 SCCM |  |
| Inflow amount from activation chamber (B) | 100 SCCM |  |
| Inflow amount from gas bomb |  | CF$_4$ 50 SCCM<br>SiF$_4$ 100 SCCM<br>SiH$_4$ 100 SCCM<br>Disiloxane 50 SCCM<br>H$_2$ 100 SCCM |
| Inner pressure in film forming chamber | 0.3 Torr. | 1.0 Torr. |
| Substrate temperature | 220° C. | 280° C. |
| Temperature in film-forming chamber | 250° C. |  |
| Film forming speed | 35 Å/sec | 5 Å/sec |
| RF discharging power | 0.2 W/cm$^2$ | 1.8 W/cm$^2$ |
| Layer thickness of photosensitive layer 13 | 22μ | 22μ |
| Average number of image defects in 10 drum-shaped image forming members for electrophotography | 5 | 20 |
| Acceptance potential irregularity in circumferential | ±12 V | ±28 V |
| Acceptance potential irregularity in axial direction | ±15 V | ±33 V |
| Remarks | Example according to the process of the invention | Example according to plasma CVD of prior art |

TABLE 3E

|  | Example 36 | Example 37 |
|---|---|---|
| Film forming starting gas | $H_3SiOSiH_3/H_2$ | $H_3SiOSiH_3/H_2/F_2$ |
| Rectifying ratio of diode (*1) | $2.1 \times 10^2$ | $2.6 \times 10^2$ |
| n value of diode (*2) | 1.1 | 1.1 |

*1 Ratio of forward current to backward current at voltage 1 V
*2 n value (Quality Factor) in the current formula of p-n junction:

$$J = J_s \left\{ \exp\left(\frac{eV}{RT}\right) - 1 \right\}$$

TABLE 1F

|  | Example 3 | Example 39 |
|---|---|---|
| Gas for forming active species (B) | $(C_2H_5)_3SiNH_2/H_2/F_2$ | $(C_2H_5)_3SiNH_2/H_2/F_2$ |
| Substrate temperature (°C.) | 200 | 200 |
| $\sigma_d$ (Non-doped) $(\Omega \cdot cm)^{-1}$ | $1.5 \times 10^{-9}$ | $1.1 \times 10^{-9}$ |

TABLE 2F

|  | Example 40 | Comparative example 6 |
|---|---|---|
| Gas for forming active species (A) | $CF_4/SiF_4$ |  |
| Activation temperature | 1000° C. |  |
| Main active species | $CF_2^*$ $SiF_2^*$ |  |
| Gas for forming active species (B) | Triethyldisilazane $H_2$ |  |
| Inflow amount from activation chamber (A) | 200 SCCM |  |
| Inflow amount from activation chamber (B) | 100 SCCM |  |
| Inflow amount from gas bomb | $SiF_4$ 100 SCCM | $CF_4$ 50 SCCM $SiH_4$ 100 SCCM Triethyldisilazane 50 SCCM $H_2$ 100 SCCM |
| Inner pressure in film forming chamber | 0.5 Torr. | 1.0 Torr. |
| Film forming speed | 35 Å/sec | 5 Å/sec |
| RF discharging power | 0.2 W/cm² | 1.8 W/cm² |
| Layer thickness of | 22μ | 22μ |
| Average number of image defects in 10 drum-shaped image forming members for electrophotography | 6 | 18 |
| Acceptance potential irregularity in circumferential | ±10 V | ±30 V |
| Acceptance potential irregularity in axial direction | ±15 V | ±35 V |
| Remarks | Example according to the process of the invention | Example according to plasma CVD of prior art Substrate temperature 250° C. |

TABLE 3F

|  | Example 41 | Example 42 |
|---|---|---|
| Film forming starting gas | $(C_2H_5)_3SiNH_2/H_2$ | $(C_2H_5)_3SiNH_2/H_2/F_2$ |
| Substrate temperature (°C.) | 220 | 220 |
| Rectifying ratio of diode (*1) | $2.9 \times 10^2$ | $3.0 \times 10^2$ |
| n value of diode | 1.1 | 1.2 |

*1 Ratio of forward current to backward current at voltage 1 V
*2 n value (Quality Factor) in the current formula of p-n junction:

$$J = J_s \left\{ \exp\left(\frac{eV}{RT}\right) - 1 \right\}$$

What we claimed is:

1. A process for forming a deposited film including carbon as a constitutent element of said film, comprising:

separately introducing into a film forming space housing a substrate therein a gaseous or gasified active species (A) formed in an activation chamber (a) by decomposition of a chain or cyclic hydrocarbon of which hydrogen atoms are partially or wholly substituted with halogen atoms and a gaseous or gasified active species (B) formed in an activation chamber (b) which is different from said activation chamber (a) from a chemical substances for film formation which is reactive with said active species (A) and is selected from the group consisting of hydrogen gas, halogen gas and a mixture thereof;

providing both active species (A) and (B) with discharge energy in said film forming space sufficient to promote a chemical reaction therebetween; and allowing both active species (A) and (B) to react with each other thereby forming the deposited film on the substrate.

2. A process according to claim 1, wherein an active species (SX) formed by decomposition of a compound containing silicon and a halogen is used in addition to said active species.

3. A process according to claim 1, wherein an inert gas carrier is combined with said hydrogen gas, said halogen gas, or said mixture thereof.

* * * * *

UNITED STATES PATENT AND TRADEMARK OFFICE
CERTIFICATE OF CORRECTION

PATENT NO. : 4,853,251

DATED : August 1, 1989

INVENTOR(S) : SHUNICHI ISHIHARA, ET AL.

It is certified that error appears in the above-identified patent and that said Letters Patent is hereby corrected as shown below:

ON THE TITLE PAGE,
IN [56] REFERENCES CITED

U.S. PATENT DOCUMENTS, "Dieiling" should read --Dreiling--.

COLUMN 3

Line 48, "I) cyclic" should read --I), cyclic--.

COLUMN 4

Line 24, "react" should read --reacts--.
    Line 27, "resulting" should read --resulting in--.

COLUMN 5

Line 6, "hydrocarbn" should read --hydrocarbon--.
    Line 17, Italics should be deleted and "mentiooned" should read --mentioned--.
    Line 18, Italics should be deleted.
    Line 56, "hydrocarbns" should read --hydrocarbons--.

COLUMN 6

Line 6, "As" should read --The--.
    Line 28, "dichlorofuloromethylsilane," should read --dichlorofluoromethylsilane,--.
    Line 29, "chlorofulorodimethylsilane," should read --chlorofluorodimethylsilane,--.
    Line 54, "triethylfulorosilane," should read --triethylfluorosilane,--.
    Line 68, "mroe" should read --more--.

UNITED STATES PATENT AND TRADEMARK OFFICE
CERTIFICATE OF CORRECTION

PATENT NO. : 4,853,251
DATED : August 1, 1989
INVENTOR(S) : SHUNICHI ISHIHARA, ET AL.

It is certified that error appears in the above-identified patent and that said Letters Patent is hereby corrected as shown below:

COLUMN 7

Line 1, "etc.)" should read --etc.),--.
Line 40, "etc. com-" should read --etc., com- --.

Line 41, "pounds aforesaid" should read --pounds such as the aforesaid--.

COLUMN 8

Line 6, "$CH_3Si(OCH_3)_3$)," should read --$CH_3Si(OCH_3)_3$,--.
Line 45, "an" should read --a--.

COLUMN 10

Line 14, "optinally" should read --optionally--.
Line 21, "an" should read --a--.
Line 50, "metral" should read --metal--.

COLUMN 11

Line 5, ""A-C(H,X,Si)";" should read --"A-C(H,X,Si)");--.
Line 12, "A-Si(H,X));" should read --"A-Si(H,X)");--.
Line 54, "ance" should read --ence--.

COLUMN 12

Line 9, "SiC(H,X)";" should read --SiC(H,X)");--.
Line 11, "gen germanium," should read --gen, germanium,--.

UNITED STATES PATENT AND TRADEMARK OFFICE
CERTIFICATE OF CORRECTION

PATENT NO. : 4,853,251
DATED : August 1, 1989
INVENTOR(S) : SHUNICHI ISHIHARA, ET AL.

It is certified that error appears in the above-identified patent and that said Letters Patent is hereby corrected as shown below:

COLUMN 12

Line 12, "A-Si(H,X,Ge,C);" should read --"A-Si(H,X,Ge,C)");--.
    Line 44, "a" should read --an--.
    Line 56, "illustraction" should read --illustration--.

COLUMN 13

Line 14, "atms," should read --atoms,--.

COLUMN 16

Line 57, "drumshaped" should read --drum-shaped--.

COLUMN 17

Line 1, "$SIF_2^*$ active species $CF_2^*$" should read --$SIF_2^*$, active species $CF_2^*$--.
    Line 37, "Example 6" should read --Example 4--.

COLUMN 18

Line 63, "250 µm" should read --250 µm,--.

COLUMN 19

Line 1, "EXAMPLE 7-9" should read --EXAMPLES 7-9--.
    Line 37, "$CF^{2*}$" should read --$CF_2^*$--.
    Line 62, "inflow 217-1." should read --inflow pipe 217-1.--.

UNITED STATES PATENT AND TRADEMARK OFFICE
CERTIFICATE OF CORRECTION

PATENT NO. : 4,853,251
DATED : August 1, 1989
INVENTOR(S) : SHUNICHI ISHIHARA, ET AL.

It is certified that error appears in the above-identified patent and that said Letters Patent is hereby corrected as shown below:

COLUMN 23

Line 8, "whlie" should read --while--.

COLUMN 24

Line 1, "wree" should read --were--.

COLUMN 27

Line 9, "introduci-" should read --introduc- --.
    Line 10, "ton" should read --tion--.

COLUMN 28

Line 64, "undre" should read --under--.

COLUMN 29

Line 42, "species (c)" should read --species (C)--.

COLUMN 30

Line 27, "formign" should read --forming--.

COLUMN 31

Line 43, "introduciton" should read --introduction--.
    Line 45, "allwoed" should read --allowed--.
    Line 64, "activation chamber (A) 122" should read
        --activation chamber (A) 112--.

UNITED STATES PATENT AND TRADEMARK OFFICE
CERTIFICATE OF CORRECTION

PATENT NO. : 4,853,251

DATED : August 1, 1989

INVENTOR(S) : SHUNICHI ISHIHARA, ET AL.

It is certified that error appears in the above-identified patent and that said Letters Patent is hereby corrected as shown below:

COLUMN 32

Line 26, "tha" should read --that--.

COLUMN 33

Line 56, "uisng" should read --using--.

COLUMN 34

Line 2, "form" should read --from--.
TABLE 1A, "$H_2F_2$" should read --$H_2/F_2$--.
TABLE 2A, "ddefects" should read --defects--.

COLUMN 35

TABLE 3A, "$J = J_s \left\{ \exp \left( \frac{eV}{RT} \right) - 1 \right\}$" should read --$J = J_s \left\{ \exp \left( \frac{eV}{nRT} \right) - 1 \right\}$--.

TABLE 2B, "Activation" should read --Activation temperature--.

COLUMN 41

TABLE 3E, "$J = J_s \left\{ \exp \left( \frac{eV}{RT} \right) - 1 \right\}$" should read --$J = J_s \left\{ \exp \left( \frac{eV}{nRT} \right) - 1 \right\}$--.

UNITED STATES PATENT AND TRADEMARK OFFICE
CERTIFICATE OF CORRECTION

PATENT NO. : 4,853,251
DATED : August 1, 1989
INVENTOR(S) : SHUNICHI ISHIHARA, ET AL.

It is certified that error appears in the above-identified patent and that said Letters Patent is hereby corrected as shown below:

COLUMN 41

TABLE 1F, " Example 3        Example 39

$(C_2H_5)_3SiNH_2/$    $(C_2H_5)_3SiNH_2/$
$H_2/F_2$                                              "

should read

-- Example 3        Example 39

$(C_2H_5)_3SiNH_2$     $(C_2H_5)_3SiNH_2/$
$H_2/F_2$                                               --.

TABLE 2F, "                             $CF_4$  50 SCCM
$SiF_4$  100 SCCM $SiH_4$  100 SCCM "

should read --           $CF_4$  50 SCCM
$SiF_4$  100 SCCM
$SiH_4$  100 SCCM --.

and "Layer thickness of" should read

--Layer thickness of
photosensitive layer 13--.

TABLE 3F, "$(C_2H_5)_3SiNH_2/H_{2/F2}$" should read
--$(C_2H_5)_3SiNH_2/H_2/F_2$--.

UNITED STATES PATENT AND TRADEMARK OFFICE
CERTIFICATE OF CORRECTION

PATENT NO. : 4,853,251
DATED : August 1, 1989
INVENTOR(S) : SHUNICHI ISHIHARA, ET AL.

It is certified that error appears in the above-identified patent and that said Letters Patent is hereby corrected as shown below:

COLUMN 42

TABLE 3F-continued, $"J = J_s\left\{\exp\left(\frac{eV}{RT}\right) - 1\right\}"$ should read $--J = J_s\left\{\exp\left(\frac{eV}{nRT}\right) - 1\right\}--$.

Line 10, "claimed" should read --claim--.
Line 22, "substances" should read --substance--.
Line 54, "halogen gas" should read --halogen gas,--.

Signed and Sealed this

Seventeenth Day of March, 1992

Attest:

HARRY F. MANBECK, JR.

*Attesting Officer*      *Commissioner of Patents and Trademarks*